(12) United States Patent
Fang et al.

(10) Patent No.: US 11,854,763 B1
(45) Date of Patent: Dec. 26, 2023

(54) BACKSCATTERED ELECTRON DETECTOR, APPARATUS OF CHARGED-PARTICLE BEAM SUCH AS ELECTRON MICROSCOPE COMPRISING THE SAME, AND METHOD THEREOF

(71) Applicant: BORRIES PTE. LTD., Singapore (SG)

(72) Inventors: Wei Fang, Saratoga, CA (US);
Xiaoming Chen, Sunnyvale, CA (US);
Daniel Tang, Fremont, CA (US);
Liang-Fu Fan, Fremont, CA (US);
Zhongwei Chen, Los Altos Hills, CA (US)

(73) Assignee: BORRIES PTE. LTD., Singapore (SG)

( * ) Notice: Subject to any disclaimer, the term of this patent is extended or adjusted under 35 U.S.C. 154(b) by 0 days.

(21) Appl. No.: 18/046,508

(22) Filed: Oct. 14, 2022

(51) Int. Cl.
*H01J 37/244* (2006.01)
*G01N 23/203* (2006.01)

(52) U.S. Cl.
CPC .......... *H01J 37/244* (2013.01); *G01N 23/203* (2013.01); *G01N 2223/053* (2013.01); *G01N 2223/3302* (2013.01); *G01N 2223/418* (2013.01); *G01N 2223/646* (2013.01); *H01J 2237/24475* (2013.01)

(58) Field of Classification Search
CPC .......... H01J 37/00; H01J 37/02; H01J 37/244; H01J 37/26; H01J 37/28; H01J 2237/24475; G01N 23/203; G01N 2223/053; G01N 2223/3302; G01N 2223/418; G01N 2223/646
USPC .................................. 250/306, 307, 311, 397
See application file for complete search history.

(56) References Cited

U.S. PATENT DOCUMENTS 8,618,499 B1 * 12/2013 Hoque .................. H01J 37/244
250/397
2022/0230845 A1 * 7/2022 Suzuki .................... H01J 37/10

* cited by examiner

Primary Examiner — Jason L McCormack
(74) Attorney, Agent, or Firm — George Guosheng Wang; Upstream Research and Patent LLC

(57) ABSTRACT

The present invention provides a backscattered electron (BSE) detector comprising two or more detection components that are electrically isolated from each other. Each of the detection components includes a single continuous top metal layer configured for directly receiving incident backscattered electrons and for backscattered electron to penetrate therethrough. The thickness of one of the top metal layers is different from the thickness of another one of the top metal layers. The BSE detector can be used in an apparatus of charged-particle beam for imaging a sample material. Signals from the detection components having top metal layers of different thicknesses can be inputted into different signal amplifier circuits to get different energy bands of BSE image.

20 Claims, 24 Drawing Sheets

BACKSCATTERED ELECTRON DETECTOR, APPARATUS OF CHARGED-PARTICLE BEAM SUCH AS ELECTRON MICROSCOPE COMPRISING THE SAME, AND METHOD THEREOF

FIELD OF THE INVENTION

The present invention generally relates to a backscattered electron (B SE) detector, and an apparatus of charged-particle beam such as electron microscope using the same. Although the invention will be illustrated, explained, and exemplified by electron microscopes, it should be appreciated that the present invention can also be applied to other fields, for example, electron beam recorder, electron beam lithography system, and the like.

BACKGROUND OF THE INVENTION

Apparatuses of charged-particle beam such as scanning electron microscope (SEM), transmission electron microscope (TEM), and scanning transmission electron microscope (STEM) are widely used in fields of medical diagnosis, biological research, material analysis, and semiconductor inspection etc. With their high-resolution image technique, TEM and STEM are used as a particularly important diagnostic tool to screen virus, human tissues at high magnification (the ultrastructural level) or material analysis, often in conjunction with other methods, particularly light microscopy, immunofluorescence techniques and PCR etc.

For example, TEM/STEM has great potential for diagnostic purposes when it (1) provides useful (complementary) information in the context of a carefully considered differential diagnosis; (2) provides an 'improved' diagnosis that results in better treatment strategies and; (3) is time & cost effective in respect to alternative techniques. For diagnostic purposes, solid tissues or virus sample can be prepared for TEM/STEM in the same way as other biological tissues. The samples are fixed in glutaraldehyde and osmium tetroxide then dehydrated and embedded in epoxy resin. The ultrathin sections may be collected on 3 mm copper (mesh) grids and stained with uranyl acetate and lead citrate to make the contents of the tissue or virus electron dense (and thus visible in the electron microscope).

Surface topographic (TOPO) variation may be imaged, usually, by collecting scattered electrons (SEs), since they result from electron—electron scattering from the surface of the specimen. On the other hand, the contrast of composition (COMPO) in atomic number of the specimen is readily obtained by the backscattered electrons (BSEs), since they result from an electron—nuclei scattering.

As compared with the SE detector, the BSE detector has more diverse applications. It is well known that BSE signals can show not only COMPO detail contrast but also TOPO variation. BSE signals have a large energy band width carrying a lot of useful information from deep material. However, such useful information cannot be revealed by current SEM BSE detectors because they don't have any energy filter (e.g., a known BSE detector as shown in FIG. 1), and they can only detect all signals without any distinction of the BSE energy bands. Advantageously, the present invention provides a backscattered electron (B SE) detector and an apparatus of charged-particle beam such as electron microscope using the same that can overcome the deficiencies of the prior art.

SUMMARY OF THE INVENTION

One aspect of the present invention provides a backscattered electron (BSE) detector comprising two or more detection components that are electrically isolated from each other. Each of the detection components includes a single continuous top metal layer configured for directly receiving incident backscattered electrons and for backscattered electron to penetrate therethrough. The thickness of one of the top metal layers is different from the thickness of another one of the top metal layers.

Another aspect of the present invention provides an apparatus of charged-particle beam comprising one or more BSE detectors, at least one of which includes two or more detection components that are electrically isolated from each other. Each of the detection components includes a single continuous top metal layer configured for directly receiving incident backscattered electrons and for backscattered electron to penetrate therethrough. The thickness of one of the top metal layers is different from the thickness of another one of the top metal layers.

A further aspect of the present invention provides a method of imaging including the following steps: (i) using an apparatus of charged-particle beam as described above for imaging a sample material; (ii) detecting backscattered electrons from the sample material with the BSE detector as described above; and (iii) inputting signals from the detection components having top metal layers of different thicknesses into different signal amplifier circuits to get different energy bands of BSE image.

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form, omitted, or merely suggested, in order to avoid unnecessarily obscuring the present invention.

FIG. 20 shows the image of a biological sample in a large FOV with low resolution and a small FOV with high resolution in accordance with an exemplary embodiment of the present invention.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

Where a numerical range is disclosed herein, unless otherwise specified, such range is continuous, inclusive of both the minimum and maximum values of the range as well as every value between such minimum and maximum values. Still further, where a range refers to integers, only the integers from the minimum value to and including the maximum value of such range are included. In addition, where multiple ranges are provided to describe a feature or characteristic, such ranges can be combined.

It is also to be understood that the terminology used herein is for the purpose of describing particular embodiments only, and it is not intended to limit the scope of the invention. For example, when an element is referred to as being "on", "connected to", or "coupled to" another element, it can be directly on, connected or coupled to the other element or intervening elements may be present. In contrast, when an element is referred to as being "directly on", "directly connected to", or "directly coupled to" another element, there are no intervening elements present.

Figure 1:
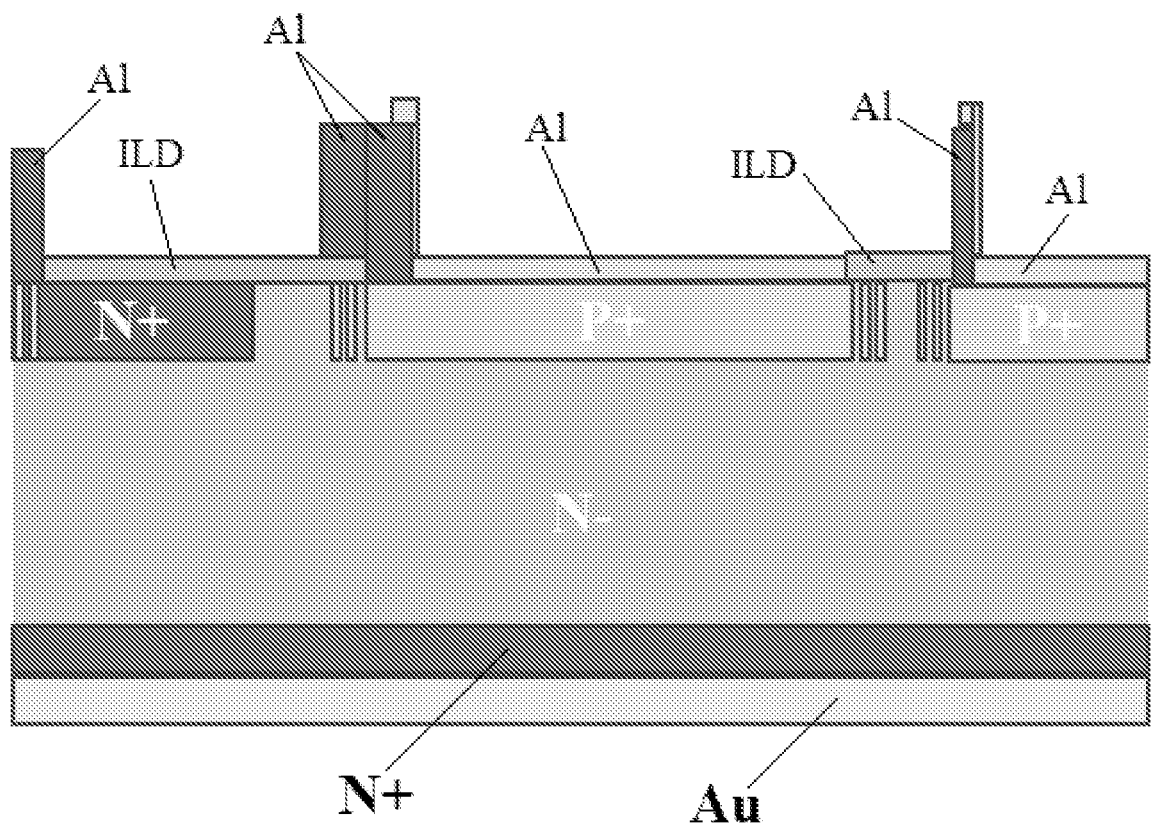
FIG. 1 shows a BSE detector without any energy filter in the prior art.
Figure 2:
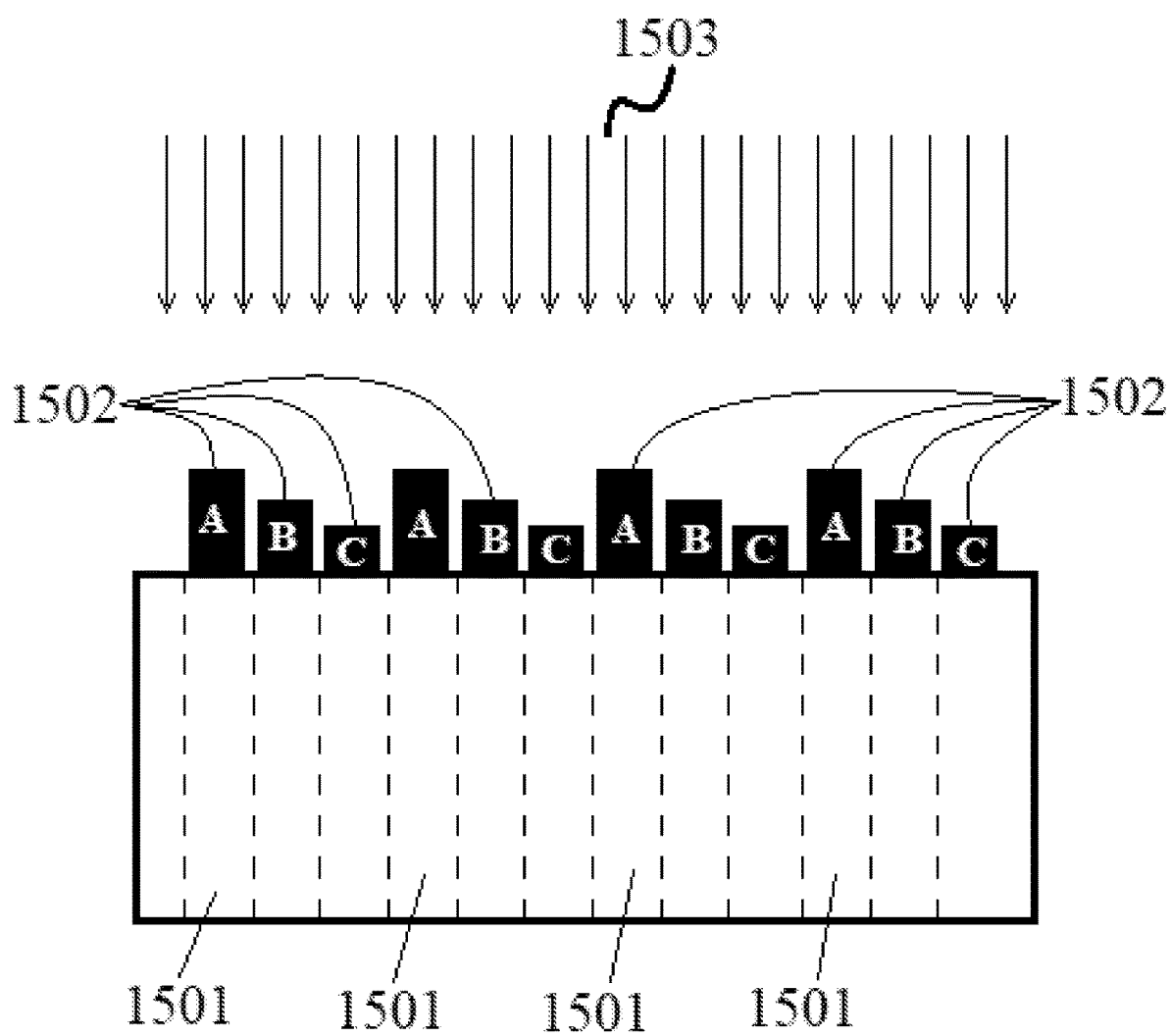
FIG. 2 schematically illustrates a general backscattered electron (BSE) detector in accordance with an exemplary embodiment of the present invention.

With reference to FIG. 2, various embodiments of the invention provide a backscattered electron (BSE) detector 15 comprising two or more detection components 1501 that are electrically isolated from each other. Each of the detection components 1501 includes a single continuous top metal layer 1502 configured for directly receiving incident backscattered electrons 1503 and for backscattered electrons 1503 to bombard onto/into the metal layer 1502 or penetrate through the metal layer 1502. Typically, the thickness within any single one of the top metal layers 1502 is uniform, for example, a thickness of A, B, C or D. However, the thickness A of one of the top metal layers 1502 is different from the thickness B of another one of the top metal layers 1502. In other words, the thicknesses of the top metal layers 1502 are not uniform.

Figure 3:
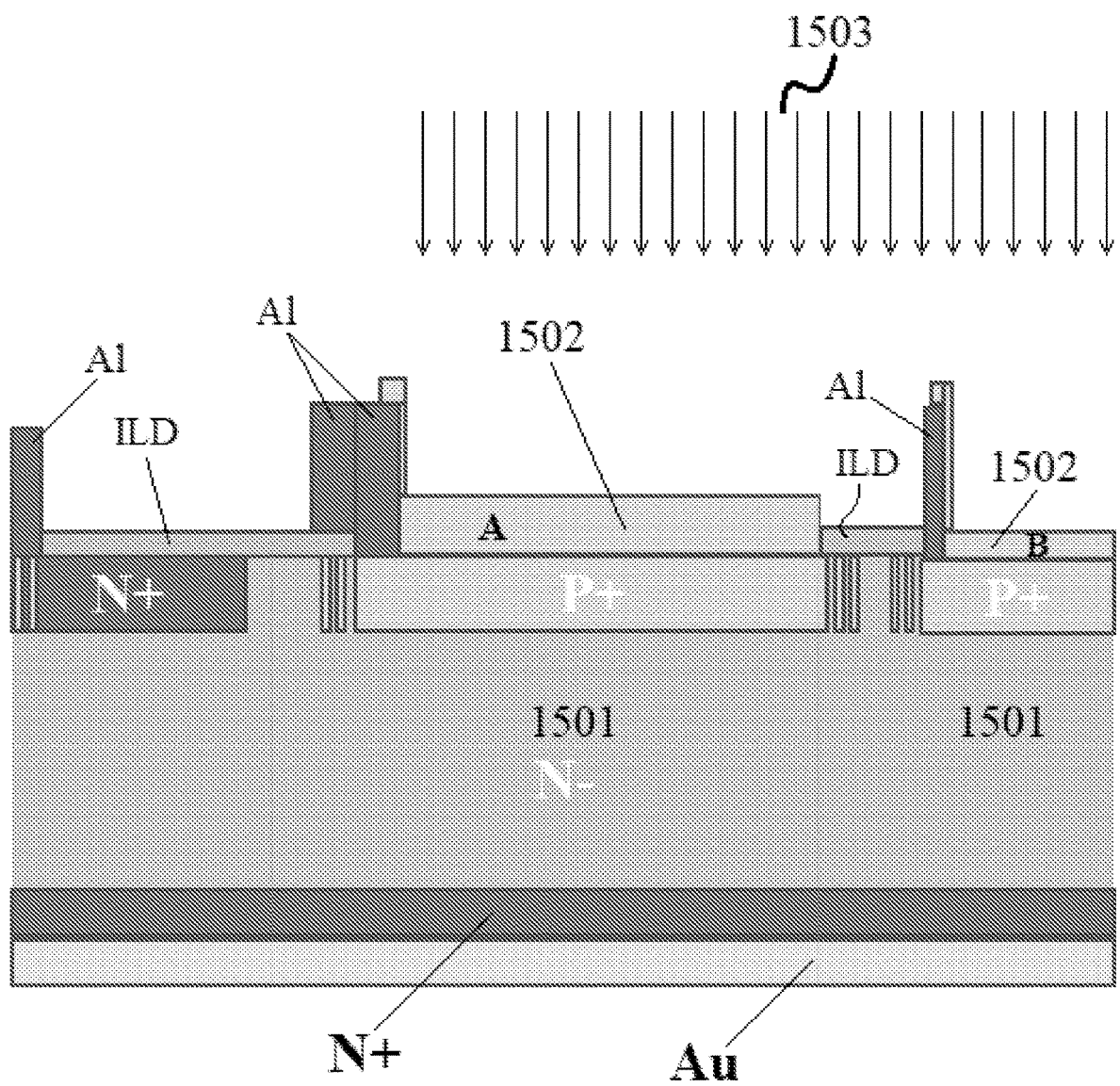
FIG. 3 schematically illustrates a BSE semiconductor detector in accordance with an exemplary embodiment of the present invention.

In some embodiments, the BSE detector 15 may be a semiconductor detector as shown in FIG. 3. The top metal layers 1502 may be readout aluminum strips (with two different thicknesses A and B) capacitively coupled to P+/N+ implant (or P-type or N-type semiconductor) using a $SiO_2$ dielectric (AC coupled); or readout aluminum strips reading charges directly out of silicon (DC coupled, not shown).

As mentioned above, the thicknesses of the top metal layers 1502 are not uniform. In preferred embodiments, the top metal layers 1502 of different thicknesses are arranged in a repeated pattern or profile, for example, ABC-ABC-ABC- . . .

Figure 4:
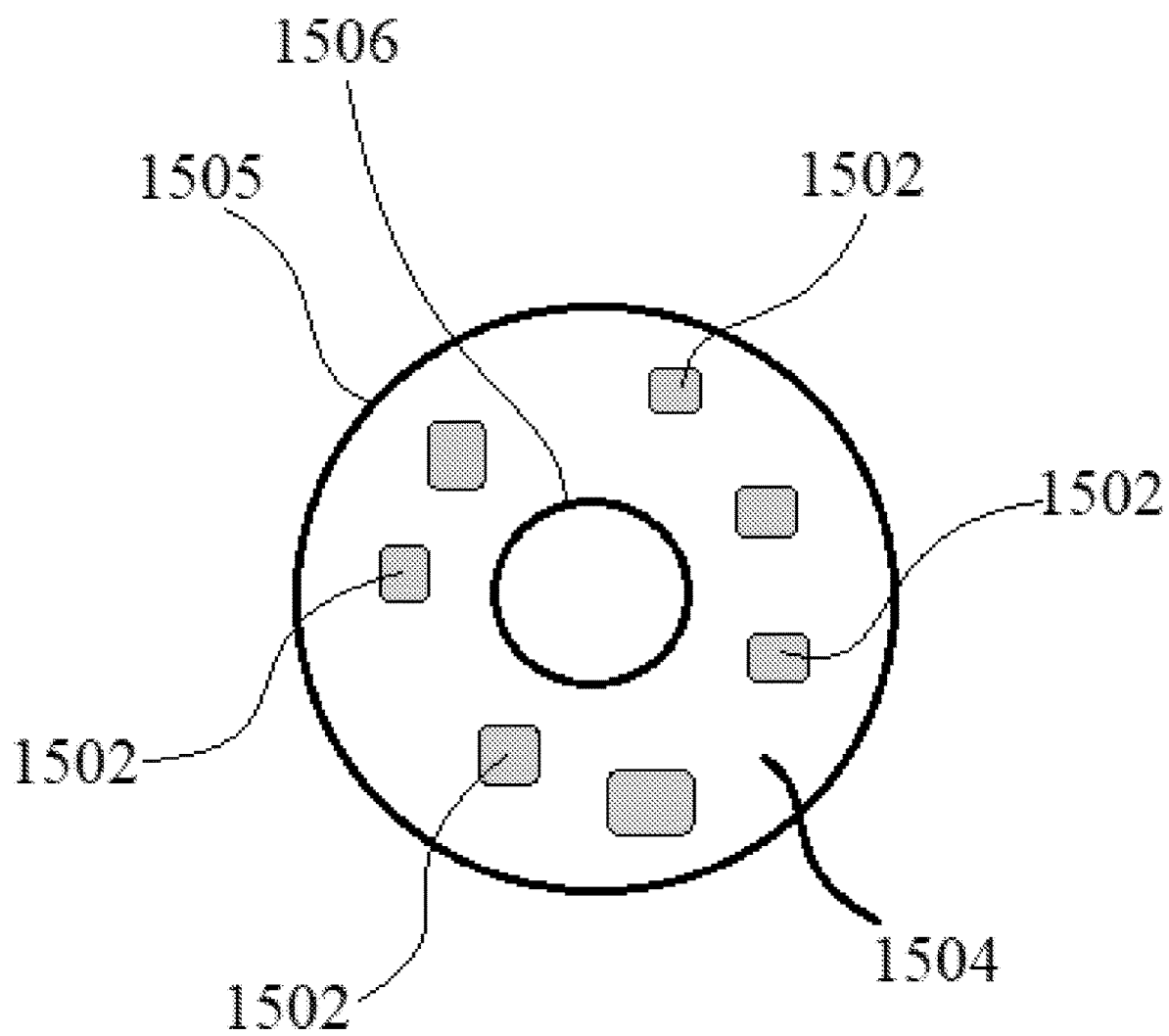
FIG. 4 schematically illustrates a "donut-shaped" face region of the BSE detector in accordance with an exemplary embodiment of the present invention.

An example of the BSE detector according to the present invention includes a "donut-shaped" face region 1504 as shown in FIG. 4. The face region 1504 is defined by a circumference of an outer boundary circle 1505 and a circumference of an inner boundary circle 1506 that is concentric with the outer boundary circle 1505. All the top metal layers 1502 are arranged within the face region 1504.

Figure 5:
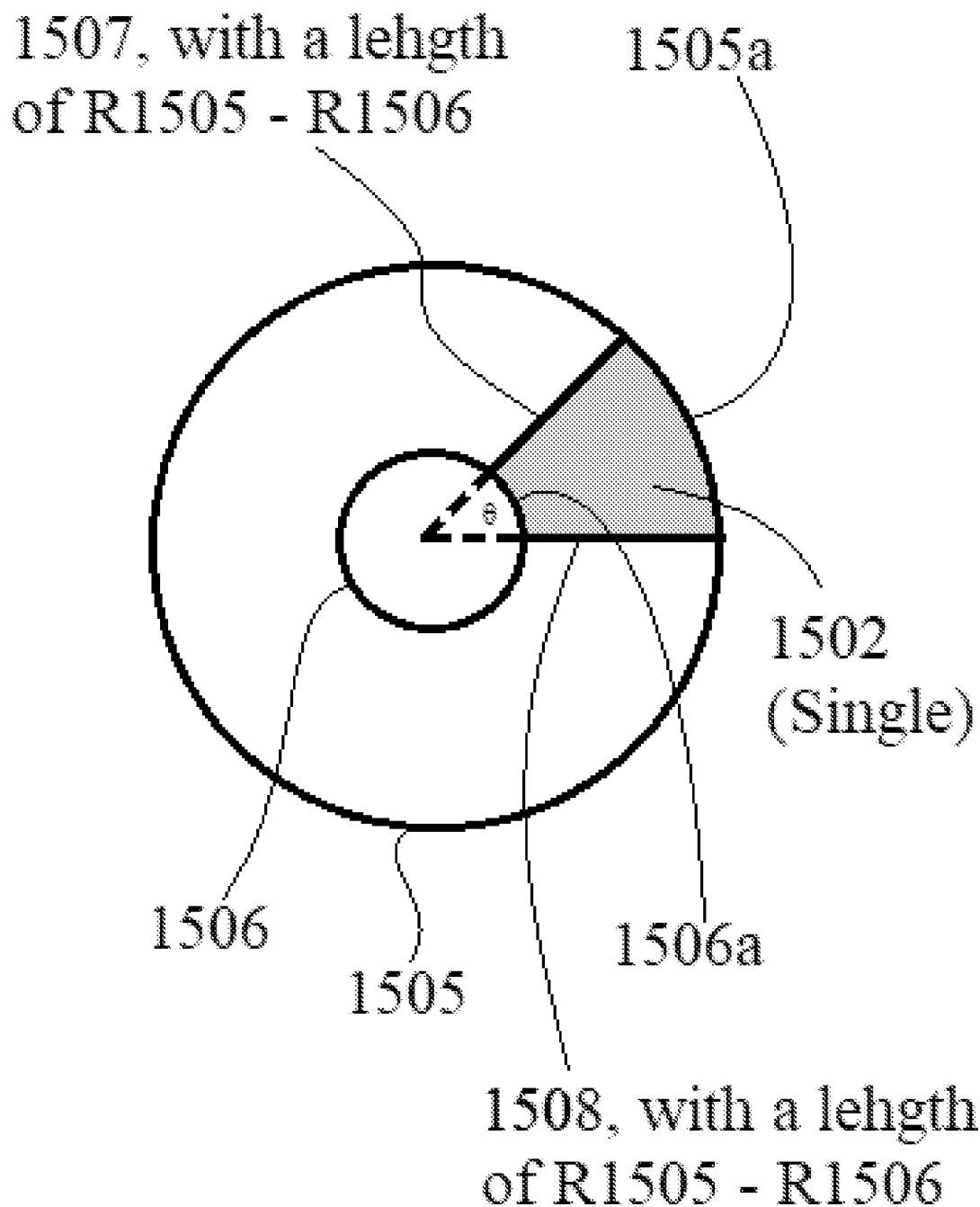
FIG. 5 schematically illustrates the shape of an individual top metal layer within the "donut-shaped" face region of the BSE detector in accordance with an exemplary embodiment of the present invention.
Figure 6:
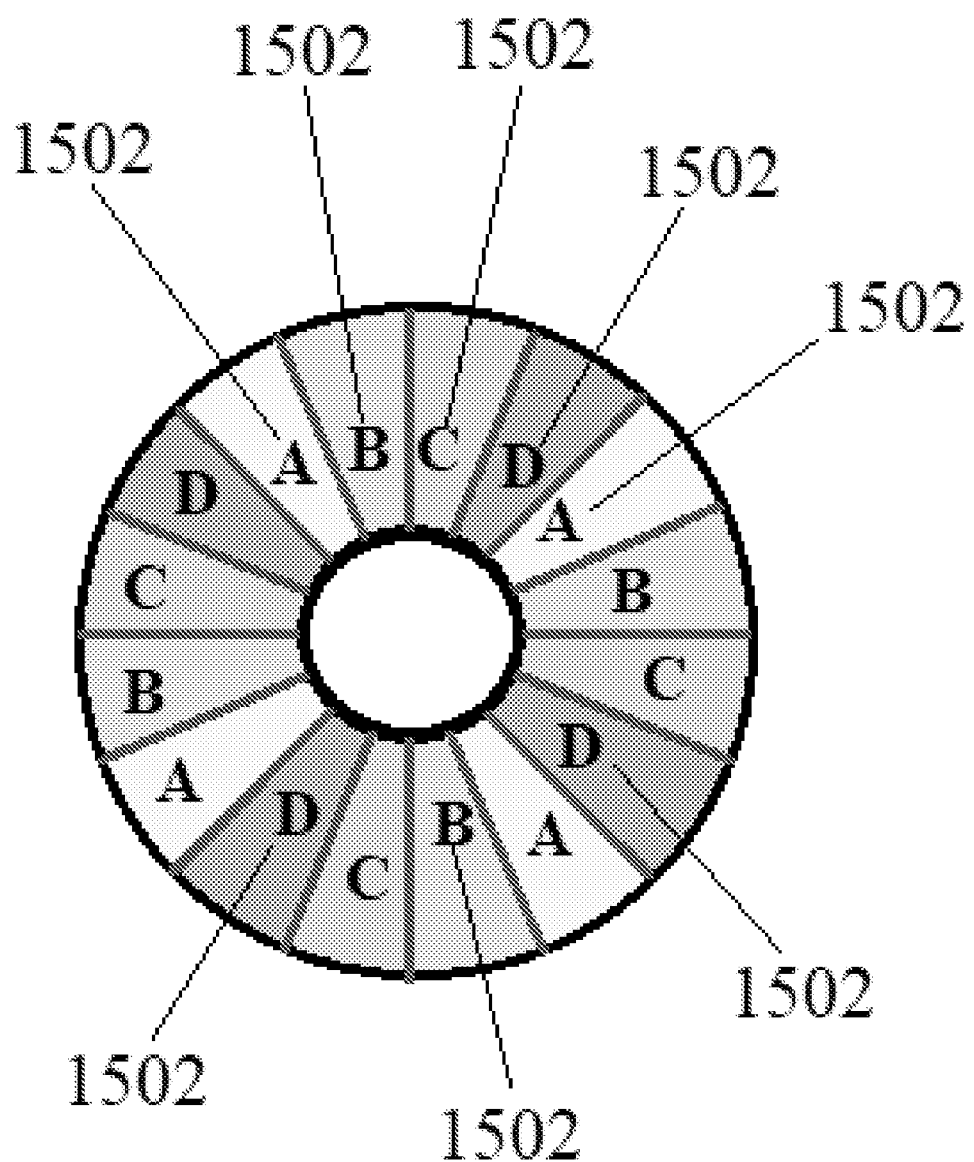
FIG. 6 illustrates a repeated pattern of top metal layers within the "donut-shaped" face region of the BSE detector in accordance with an exemplary embodiment of the present invention.

For example, each of the top metal layers 1502 may be individually enclosed or defined, as shown in FIG. 5, by an arc 1505a of the outer boundary circle 1505, an arc 1506a of the inner boundary circle 1506, and two radius segments (1507, 1508) of the outer boundary circle 1505. Each of the two radius segments (1507, 1508) has a length (or radial width) RW that equals to or less than the radius R1505 of the outer boundary circle 1505 minus the radius R1506 of the inner boundary circle 1506, RW≤(R1505-R1506). The two arcs (1505a, 1506a) share a same central angle θ)(0<θ<180° of the outer boundary circle 1505 (also of the inner boundary circle 1506). As shown in FIG. 6, N identical top metal layers (in term of shape, not thickness) may be placed within the "donut-shaped" face region 1504. Integer N may have value of ≥2, 4, 8, 16, 32, 64, 128, 256, 512, 1024, 2048, or 4096 etc. Different thicknesses of metal layers 1502 are arranged in a repeated pattern or profile, for example, ABCD-ABCD-ABCD-...

Figure 7A:
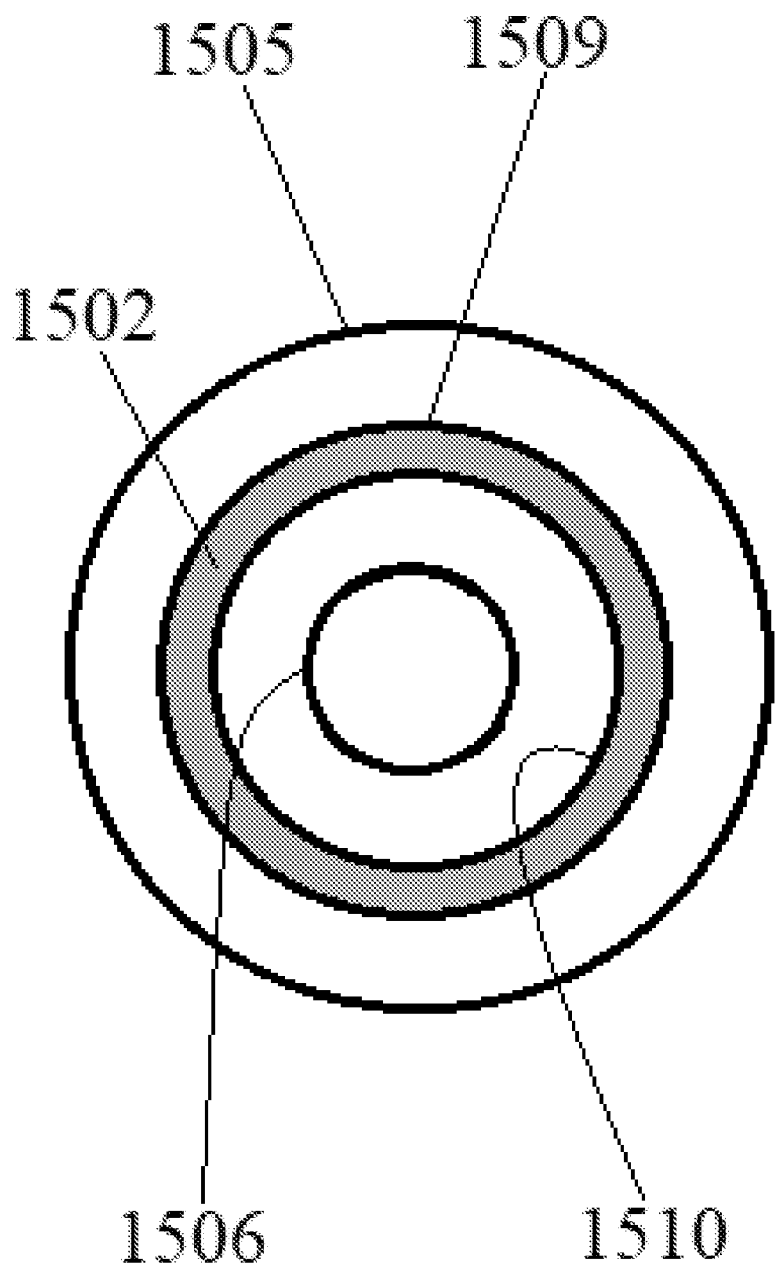
FIG. 7A schematically illustrates another shape of an individual top metal layer within the "donut-shaped" face region of the BSE detector in accordance with an exemplary embodiment of the present invention.
Figure 7B:
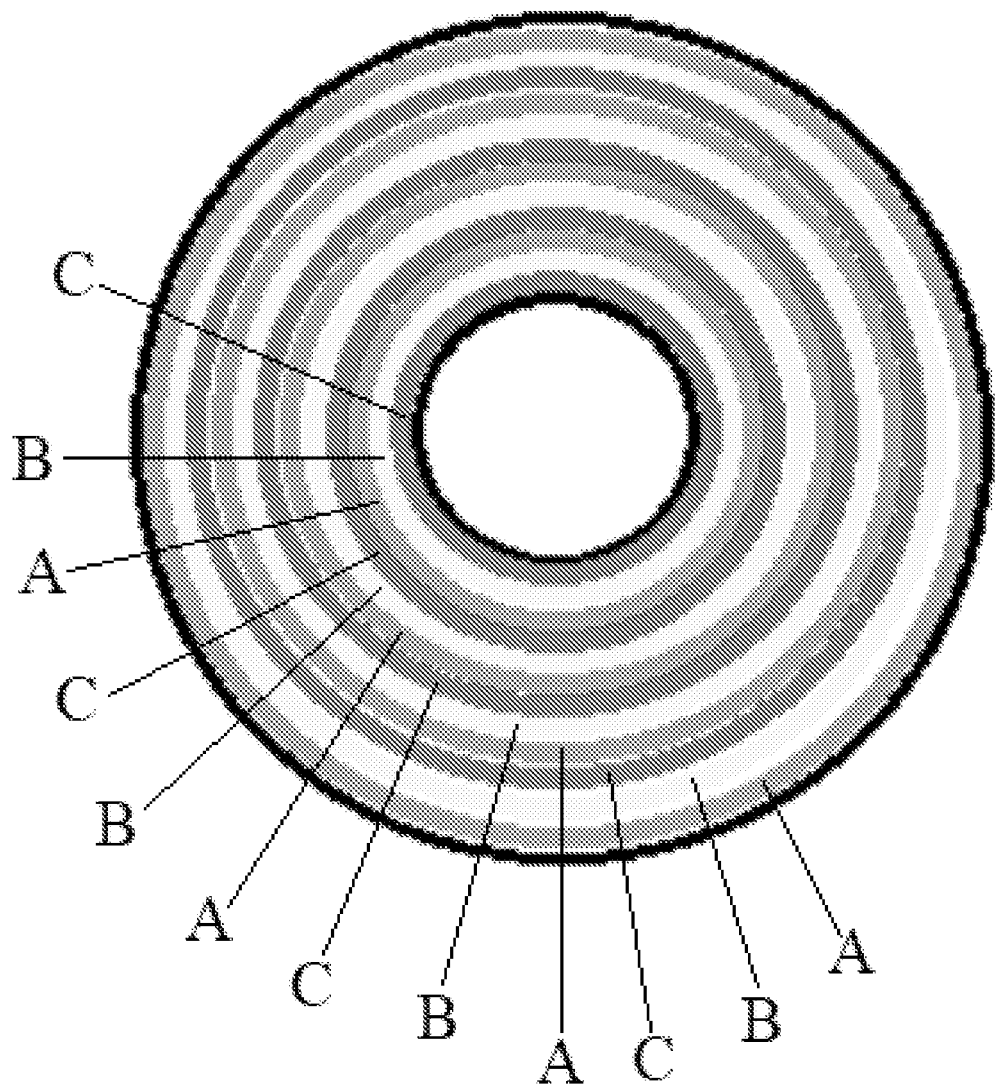
FIG. 7B schematically illustrates another repeated pattern of top metal layers within the "donut-shaped" face region of the BSE detector in accordance with an exemplary embodiment of the present invention.
Figure 7C:
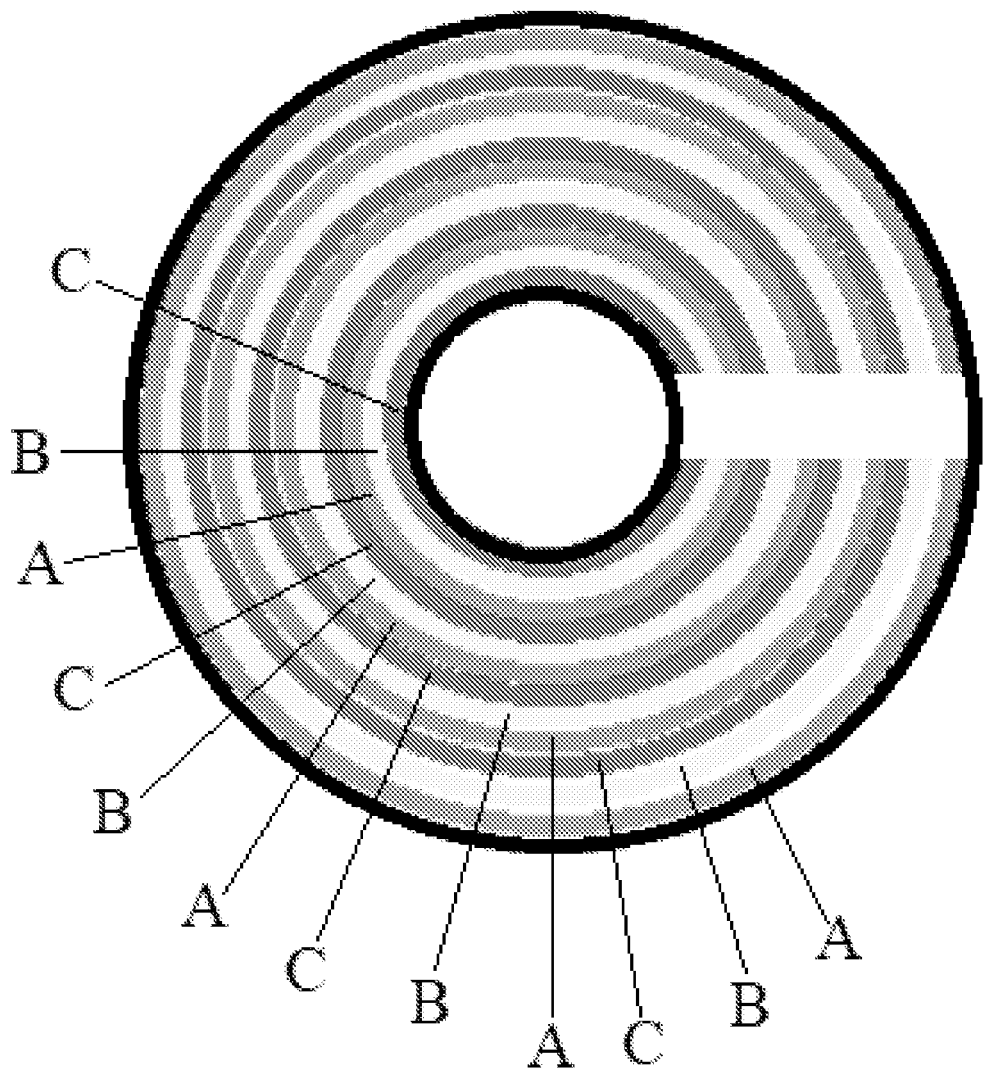
FIG. 7C schematically illustrates still another repeated pattern of top metal layers within the "donut-shaped" face region of the BSE detector in accordance with an exemplary embodiment of the present invention.

Another Example. Each of the top metal layers 1502 may have a complete ring shape as shown in FIG. 7A (or a part of the complete ring shape, C-shape) that is enclosed or defined by a larger circle 1509 and a smaller circle 1510. The larger circle 1509 and the smaller circle 1510 are any two adjacent circles selected from the outer boundary circle 1505, the inner boundary circle 1506, and one or more middle circles (such as 1509 and 1510) between the outer boundary circle 1505 and the inner boundary circle 1506. The one or more middle circles are all concentric with the outer boundary circle 1505 and the inner boundary circle 1506. Such a top metal layer may be named as a concentric belt or concentric ring. As shown in FIG. 7B, N identical concentric belts or concentric rings 1502 (in term of shape, not thickness) may be placed within the "donut-shaped" face region 1504. Integer N may have value of ≥2, 4, 8, 16, 32, 64, 128, 256, 512, or 1024 etc. Different thicknesses of the belts or rings 1502 are arranged in a repeated pattern or profile, for example, ABCD-ABCD-ABCD-... Each of the top metal layers 1502 in FIG. 7C may be a part of the complete rings as shown in FIG. 7B.

Figure 7D:
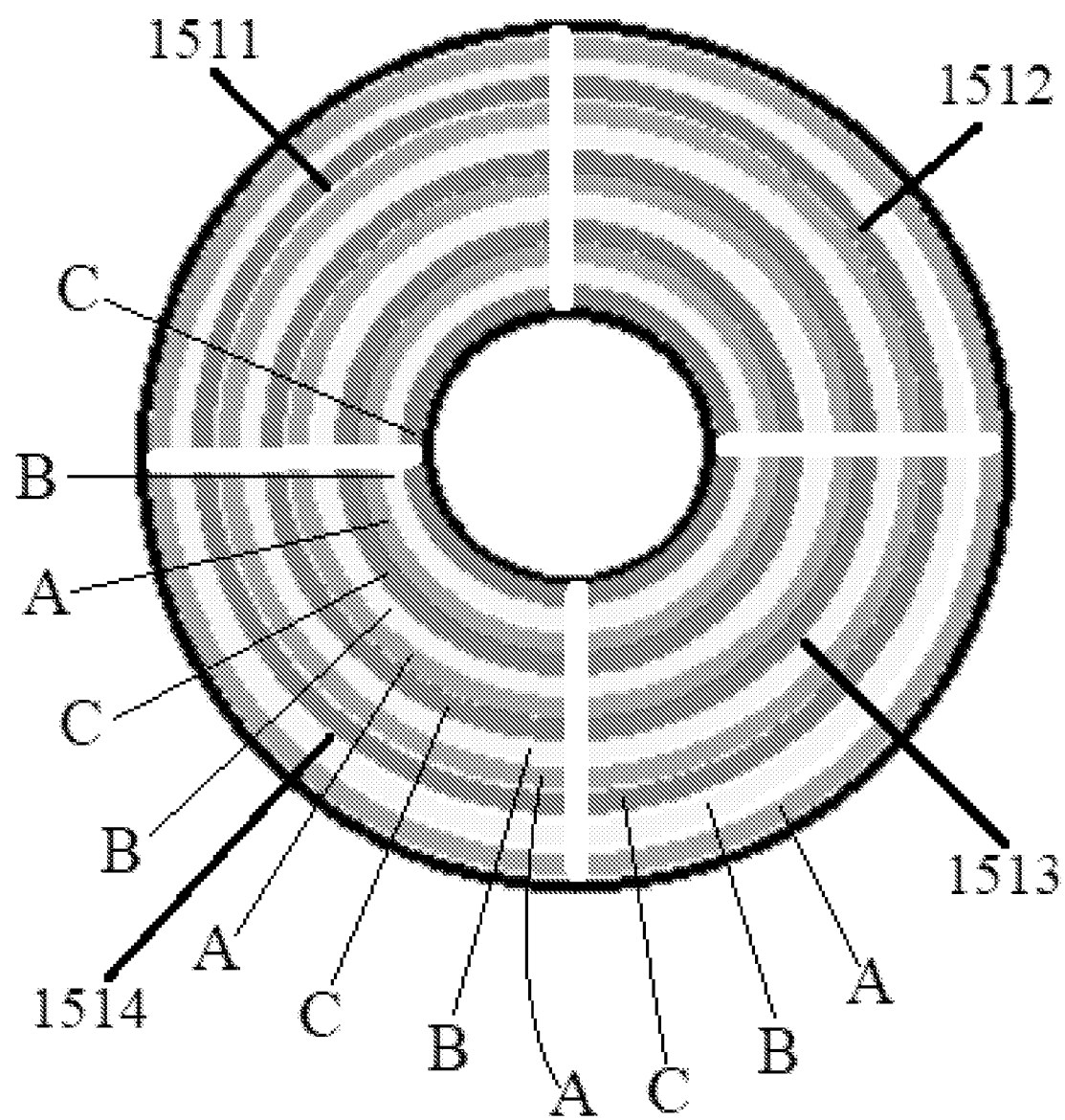
FIG. 7D schematically illustrates still another repeated pattern of top metal layers within the "donut-shaped" face region of the BSE detector in accordance with an exemplary embodiment of the present invention.

The concentric top metal layers 1502s may be further divided into 2, 4, 8, 16, 32, 64, 128, 256, 512, 1024, 2048, 4096 or more identical circular sectors. In preferred embodiments, concentric top metal layers 1502s may be further divided into 4 identical circular sectors 1511, 1512, 1513 and 1514, as shown in FIG. 7D.

Figure 8:
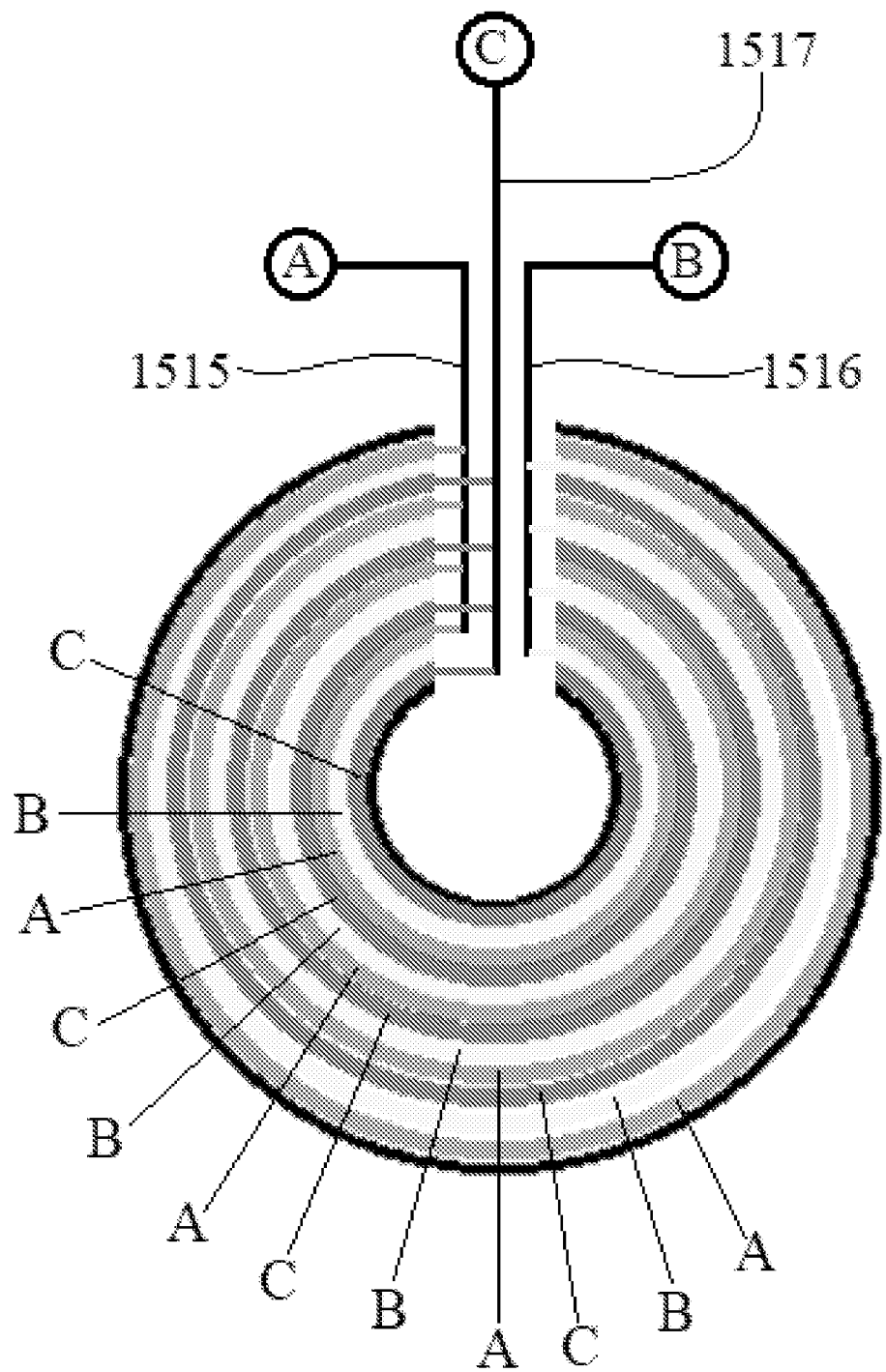
FIG. 8 schematically illustrates a BSE semiconductor detector with metal wires for outputting signals in accordance with an exemplary embodiment of the present invention.

In a variety of exemplary embodiments of the invention, one or more metal wires (1515, 1516, 1517) may be placed between two or more detection components 1501 or metal layers 1502 for outputting signals (such as a current) generated by the detection components 1501. As shown in FIG. 8, the detection components 1501 having the same thickness (A, B or C) of top metal layer 1502 are configured to output their signals through a same metal wire (1515, 1516, or 1517 respectively). The thickness (A, B or C) of the top metal layers 1502 may be varied from 5 to 100 nm such as from 10 to 50 nm.

Figure 9A:
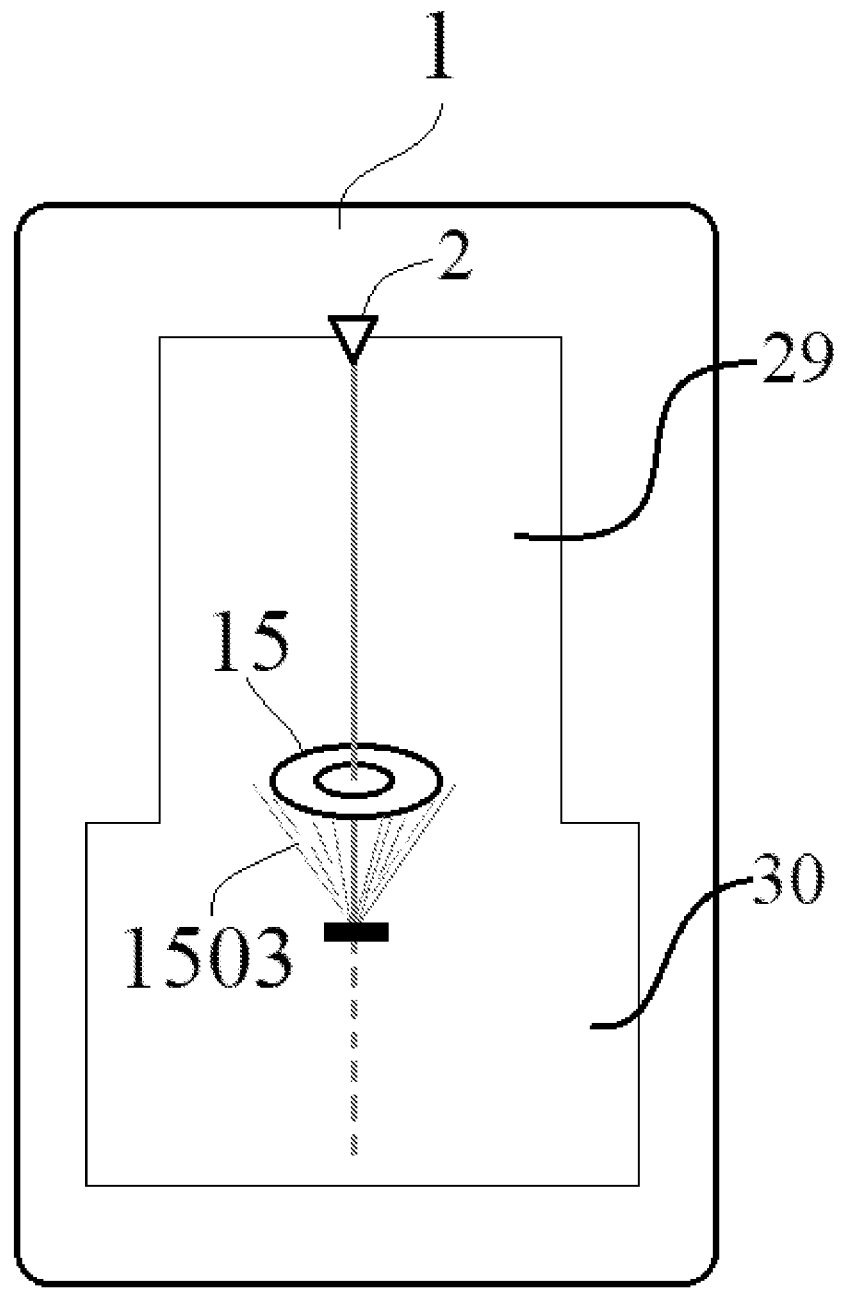
FIG. 9A schematically illustrates an apparatus of charged-particle beam such as electron microscope using the BSE semiconductor detector in accordance with an exemplary embodiment of the present invention.

With reference to FIG. 9A, various embodiments of the invention provide an apparatus of charged-particle beam 1 that includes one or more BSE detectors 15, at least one of which includes two or more detection components 1501 that are electrically isolated from each other. As described above, each of the detection components 1501 includes a single continuous top metal layer 1502 configured for directly receiving incident backscattered electrons 1503 and for backscattered electrons 1503 to penetrate therethrough. The thickness of one of the top metal layers 1502 is different from the thickness of another one of the top metal layers 1502.

Figure 9B:
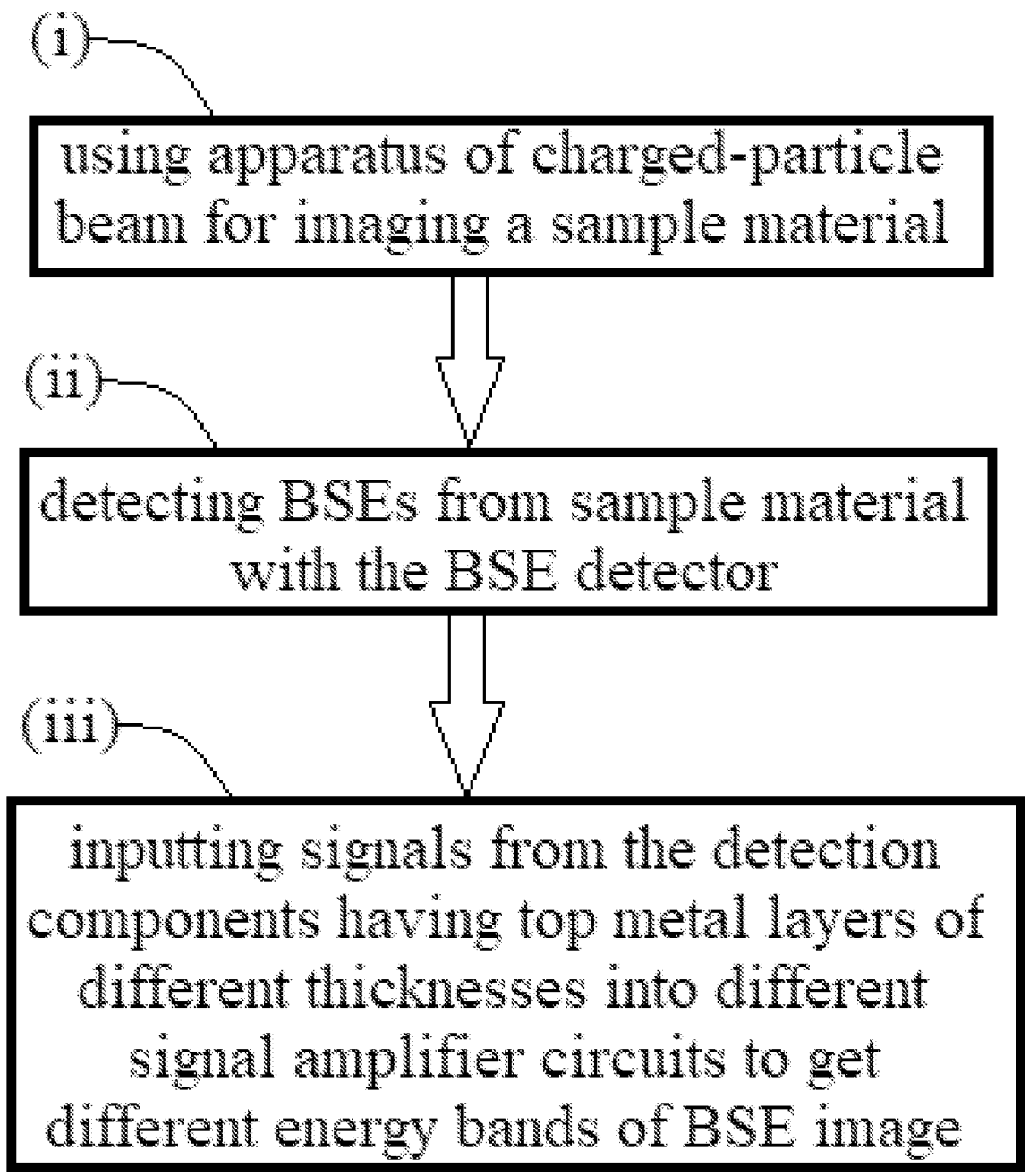
FIG. 9B is a flow chart showing an imaging method using the BSE detector in accordance with an exemplary embodiment of the present invention.

Referring to FIG. 9B, a further aspect of the present invention provides a method of imaging including the following steps: (i) using an apparatus of charged-particle beam such as EM for imaging a sample material; (ii) detecting backscattered electrons from the sample material with the BSE detector as described above; and (iii) inputting signals from the detection components having top metal layers of different thicknesses into different signal amplifier circuits to get different energy bands of BSE image.

The method of the invention may further include step (iv) of combining different energy band BSE signals to enhance a 3D information of the sample material based on image operations such as image superimposition, image subtraction, and image multiplication; and step (v-1) of revealing defects at different depths of the sample material or defects with different depths within the sample material based on the enhanced 3D information of the sample material; or step (v-2) of revealing composition variation of the sample material.

Figure 19:
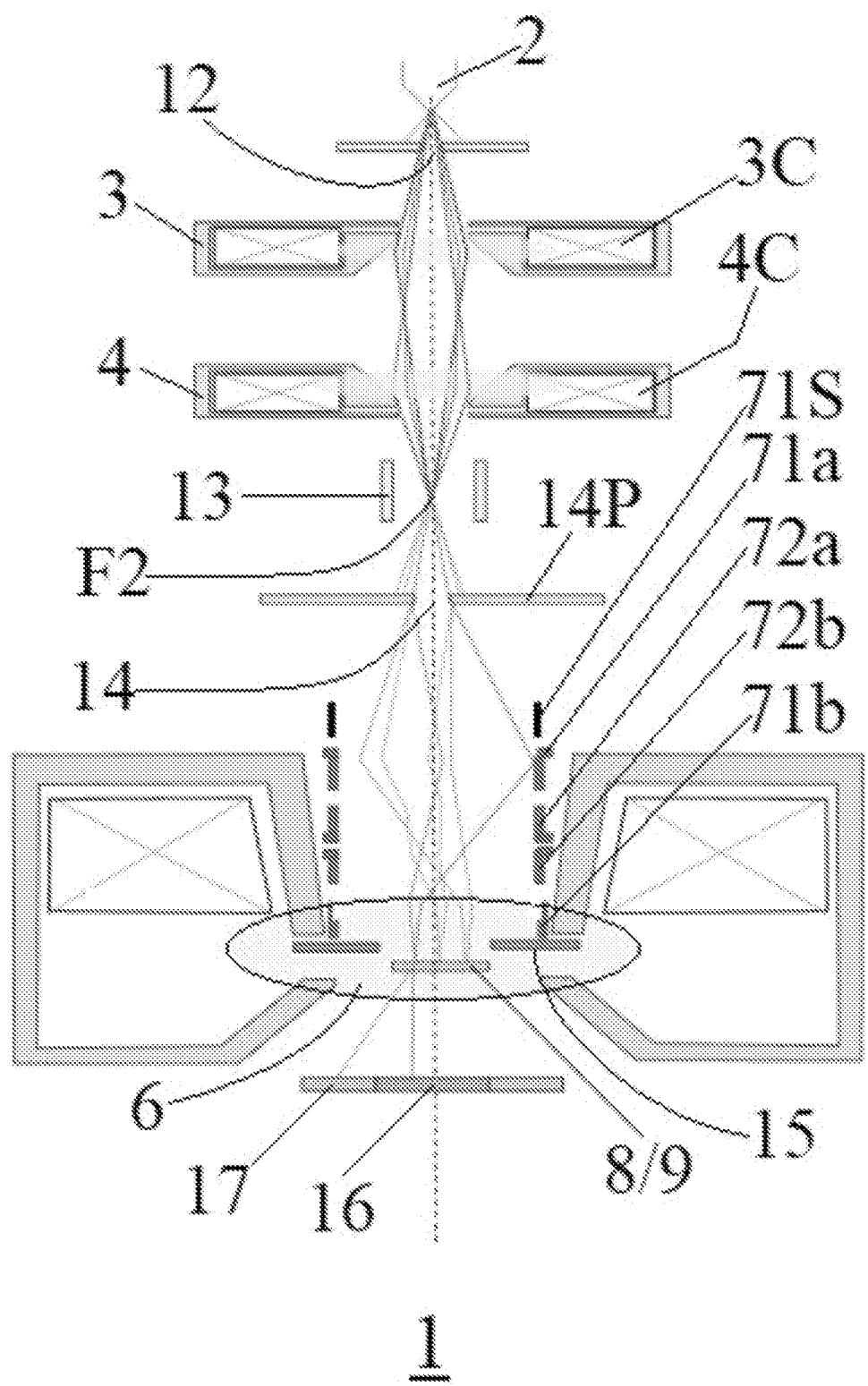
FIG. 19 shows an apparatus of charged-particle beam which can be used with the BSE detector in accordance with an exemplary embodiment of the present invention.

In some embodiments, the apparatus of charged-particle beam 1 may include a charged-particle optical column 29 and a sample chamber 30, as shown in FIG. 9A. For example, the charged-particle optical column 29 may include one or more charged-particle optical components along the beam path, selected from a source of charged particles configured to emit a beam of charged particles such as an electron gun 2 configured to emit an electron beam, condenser(s), stigmator(s), alignment coil(s), alignment plate(s), beam blanking(s), plate(s) with objective (or limiting) aperture(s), plate(s) with spread aperture(s), deflector(s), magnetic objective lens(es), and detector(s). The sample chamber 30 may include one or more chamber components selected from a specimen holder 9 for holding a specimen under examination, a receptacle for receiving a lithographical workpiece (e.g. mask or wafer) being processed with the beam, and a detector for detecting charged particles. As shown in FIG. 19, charged-particle optical components within the column 29 may be electron optical components selected from the following (from upstream to downstream): an electron gun 2 configured to emit an electron beam, a first co-condenser 3, a second co-condenser 4, a beam blanking 13, a plate 14P with an objective aperture 14, a stigmator 71s, an upper macroscopic deflector 71a, an upper microscopic deflector 72a, a lower microscopic deflector 72b, a lower macroscopic deflector 71b, a magnetic objective lens 6, and a BSE or SE detector 15. In preferred embodiments, the apparatus of charged-particle beam 1 is an electron microscope (such as TEM and STEM), or an electron beam lithography apparatus.

In an apparatus of charged-particle beam such as an electron microscope, the manipulation of an electron beam is performed using two physical effects. The interaction of electrons with a magnetic field will cause electrons to move according to the left-hand rule, thus allowing for electromagnets to manipulate the electron beam. The use of magnetic fields allows for the formation of a magnetic lens of variable focusing power, and the lens shape is determined by the distribution of magnetic flux. Electrostatic fields can cause the electrons to be deflected through a constant angle. Coupling of two deflections in opposing directions with a small intermediate gap allows for the formation of a shift in the beam path. From these two effects, as well as the use of an electron imaging system, sufficient control over the beam path is made possible. The lenses in the beam path can be enabled, tuned, and disabled entirely and simply via rapid electrical switching, the speed of which is only limited by effects such as the magnetic hysteresis.

Figure 10:
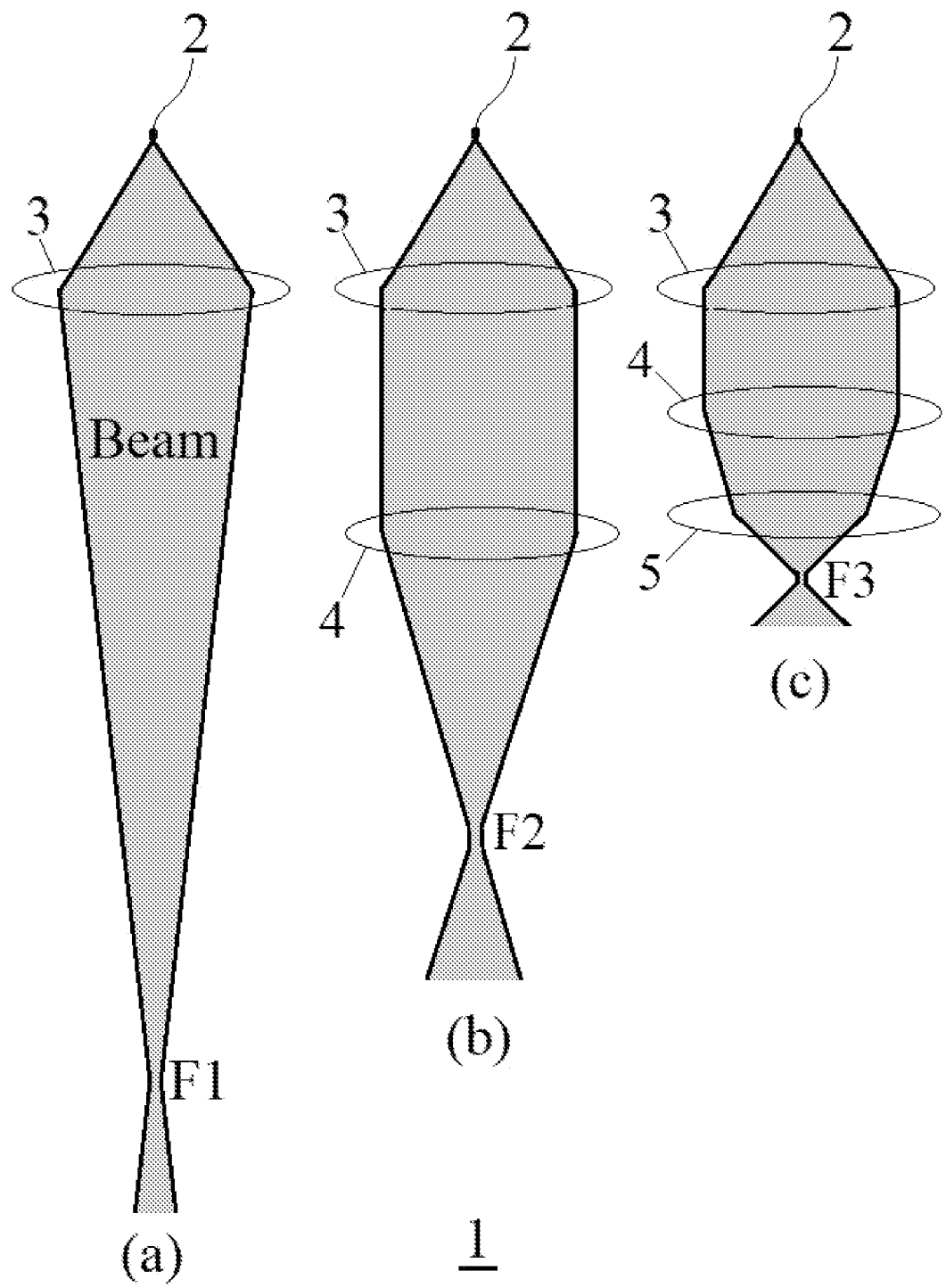
FIG. 10 schematically illustrates the formation of co-condensers which can be used in an apparatus of charged-particle beam with the BSE detector in accordance with an exemplary embodiment of the present invention.

In an apparatus 1 of charged-particle beam as shown in FIG. 10, a source 2 of charged particles is configured to emit a beam of charged particles. The source 2 may be for example an electron gun with a tungsten filament or a lanthanum hexaboride ($LaB_6$). In panel (a), a magnetic condenser 3 alone can focus the beam to a crossover spot F1. The beam is expanded after a crossover spot. In panel (b), another magnetic condenser 4 is placed between magnetic condenser 3 and crossover spot F1, and the beam is now focused to a new crossover spot F2 that is closer to source 2 than spot F1. In panel (c), a third magnetic condenser 5 is placed between magnetic condenser 4 and crossover spot F2, and the beam is again focused to another new crossover spot F3 that is even closer to source 2 than spot F2.

Generally, a condenser lens forms an image of the primary electron beam source for an objective lens, and the objective lens focuses the condenser lens image onto a specimen. Transmitted, secondary and backscattered electrons are released from the specimen material. These electrons are detected, amplified and the resulting signal used to modulate the beam of an imaging system operating synchronously with the scanning electron beam. The result is an image of the scanned area based on the electrons emitted or scattered from the specimen.

In the present invention, the term "co-condensers" is defined as two or more magnetic condensers configured to coherently focus the beam to a single crossover spot F. For example, magnetic condensers 3 and 4 in panel (b) coherently focus the beam to a single crossover spot F2, and they may be called a set of co-condensers. Magnetic condensers 3, 4 and 5 in panel (c) coherently focus the beam to a single crossover spot F3, and they may also be called a set of co-condensers. As shown in FIG. 10, the beam does not have any crossover spot between any two of the two or more magnetic condensers within a set of co-condensers.

The crossover spot F may be movable or immovable. In some embodiments of the invention, the single crossover spot F is so controlled that it remains stationary or immovable relative to the source 2 of charged particles. For example, crossover spot F2 may be kept stationary relative to the source 2, i.e. the distance D0 between spot F2 and source 2 remains unchanged. By the same token, crossover spot F3 may be kept stationary relative to the source 2, i.e. the distance D0 between spot F3 and source 2 remains unchanged.

While the single crossover spot F remains immovable relative to the source 2 of charged particles, the size A of the beam at crossover spot F (i.e. the cross-sectional area of the beam at F) may be so controlled to have a desired value. Preferably, size A may be tuned/adjusted by concertedly tuning/adjusting the individual condensing capacity of the two or more magnetic condensers within a set of co-condensers. For example, the condensing capacity of condenser 3 and that of condenser 4 may be individually but concertedly tuned/adjusted so that not only the single crossover spot F2 is fixed relative to the source 2, but also the size A of the beam at crossover spot F2 is controlled to have a value as desired. Likewise, the condensing capacities of two or more condensers 3, 4 and 5 may be individually but concertedly tuned/adjusted so that not only the single crossover spot F3 is fixed relative to the source 2, but also the size A of the beam at crossover spot F3 is controlled to have a value as desired. The two or more co-condensers are therefore configured to coherently focus the beam to the same cross-over point with different magnification rates.

Although the apparatus 1 may include one, two or more sets of co-condensers, in some preferred embodiments of the invention, the apparatus 1 includes only one set of co-condensers with only two magnetic condensers configured to coherently focus the beam to a single crossover spot F. For example, the apparatus 1 may include only one set of co-condensers as shown in Panel (b) of FIG. 10 with only two magnetic condensers (3, 4) configured to coherently focus the beam to a single crossover spot F2.

Figure 11:
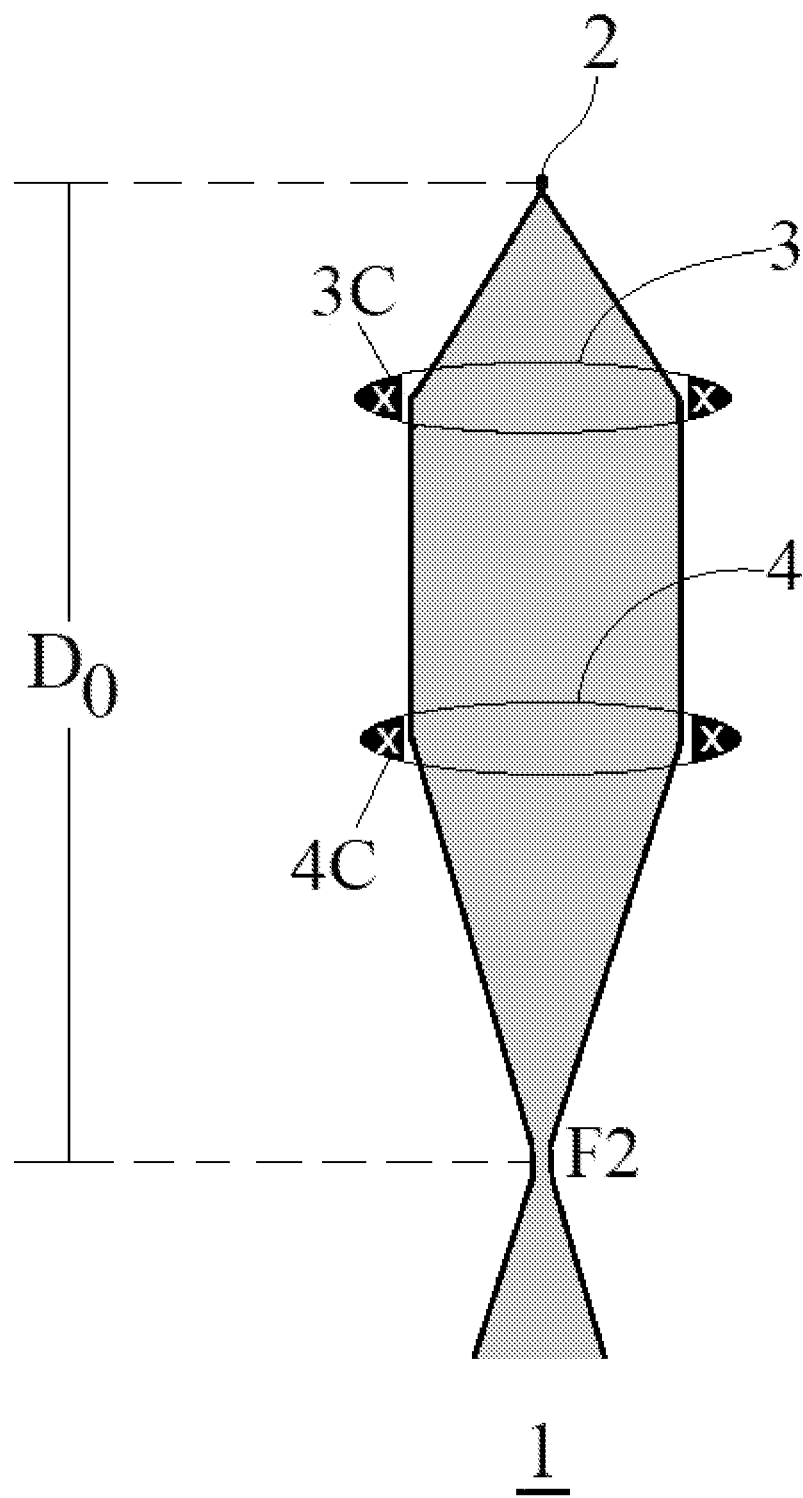
FIG. 11 shows two co-condensers with magnetic coils which can be used in an apparatus of charged-particle beam with the BSE detector in accordance with an exemplary embodiment of the present invention.

Referring to FIG. 11, the only two magnetic condensers (3, 4) include a distal magnetic condenser 4 which is distal to the source 2, and a proximal magnetic condenser 3 that is located between the source 2 and the distal magnetic condenser 4. The proximal magnetic condenser 3 comprises a magnetic coil 3C driven by a coil current I1; and the distal magnetic condenser 4 comprises a magnetic coil 4C driven by a coil current I2. Generally, both coil currents I1 and I2 are greater than 0 (>0).

In preferred embodiments of the invention, coil currents I1 and I2 are configured to position single crossover spot F2 at a fixed position, i.e. maintain a predetermined distance D0 from source 2. With the "Fixed F2" condition being met, the size A of the crossover spot F2 may be increased by increasing coil current I1 and/or decreasing coil current I2; and decreased by decreasing coil current I1 and/or increasing coil current I2. The size A of the crossover spot F2 will be minimized when coil current I1 reaches its minimal value while coil current I2 reaches its maximal value. The size A is maximized when coil current I2 reaches its minimal value while I1 reaches its maximal value. There is no special limitation on the maximized size A, it may be smaller than, equal to, or bigger than the size of the source 2.

Figure 12:
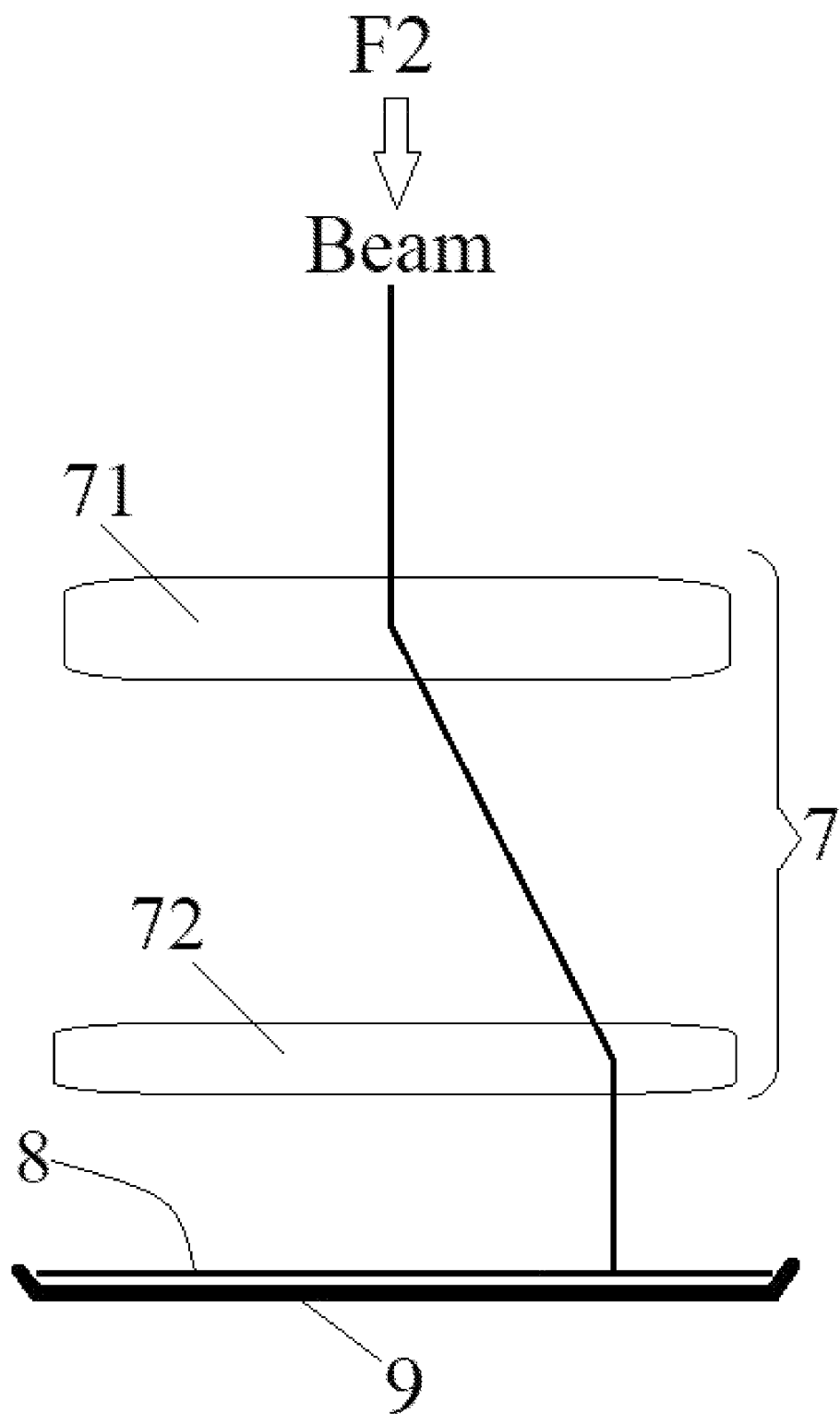
FIG. 12 illustrates an apparatus of charged-particle beam with a magnetic objective lens and a deflection system in accordance with an exemplary embodiment of the present invention.
Figure 17:
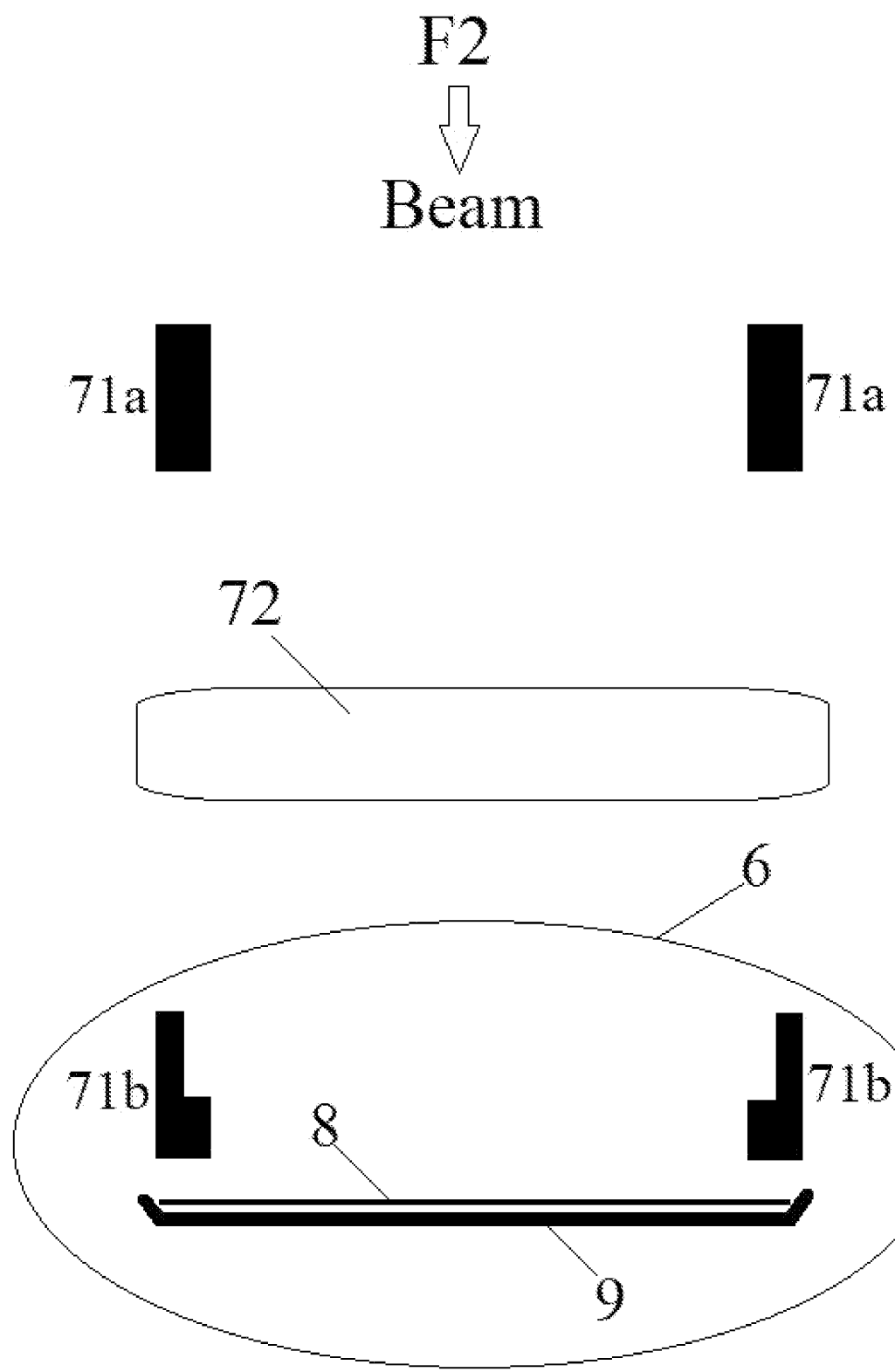
FIG. 17 schematically illustrates the configuration of a macroscopic deflection sub-system in accordance with an exemplary embodiment of the present invention.
Figure 18:
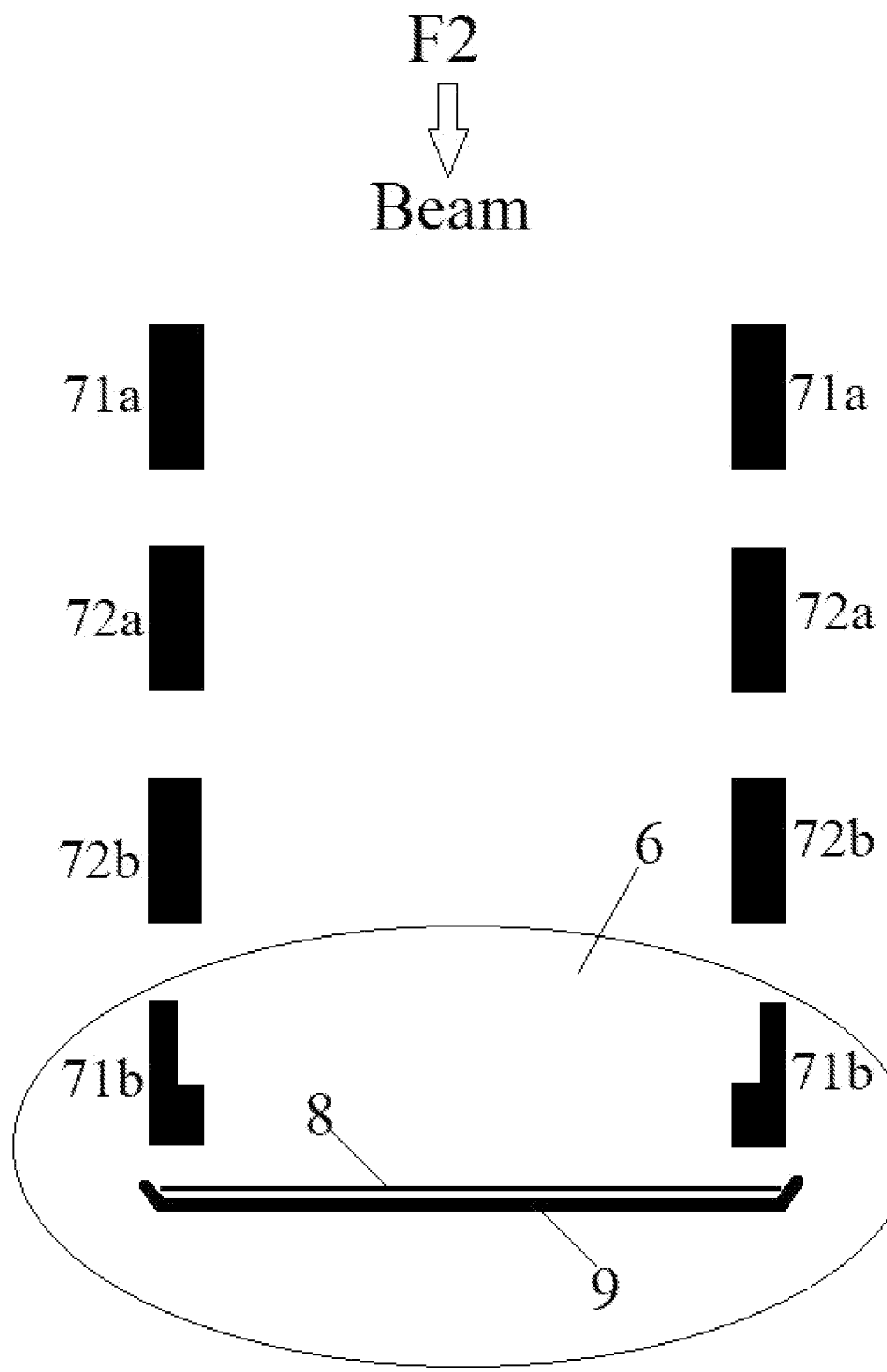
FIG. 18 schematically illustrates the configuration of a microscopic deflection sub-system in accordance with an exemplary embodiment of the present invention.

In various exemplary embodiments as shown in FIG. 12, the apparatus of charged-particle beam according to the invention may include a magnetic objective lens 6 (as shown in FIGS. 17-19) and a deflection system 7, both of which are downstream with respect to the single crossover spot F (e.g. F2). Although electron lenses may operate electrostatically or magnetically, most electron lenses use electromagnetic coils to generate a convex lens. The field produced for the lens is typically radially symmetrical, as deviation from the radial symmetry of the magnetic lens causes aberrations such as astigmatism and worsens spherical and chromatic aberration. For example, a quadrupole lens is an arrangement of electromagnetic coils at the vertices of the square, enabling the generation of a lensing magnetic fields, the hexapole configuration simply enhances the lens symmetry by using six, rather than four coils. Electron lenses may be manufactured from iron, iron-cobalt or nickel cobalt alloys, such as permalloy, due to their good magnetic properties, such as magnetic saturation, hysteresis and permeability. It should be appreciated that the objective lens 6 may be an electromagnetic lens or an electrostatic lens.

Objective lens 6 allows for electron beam convergence, with the angle of convergence as a variable parameter. The magnification may be simply changed by modifying the amount of current that flows through the coil of lenses. Lens 6 may include yoke, magnetic coil, poles, pole piece, and external control circuitry. An electromagnetic lens may include an upper pole piece and a lower pole piece. The pole piece must be manufactured in a very symmetrical manner, as this provides the boundary conditions for the magnetic field that forms the lens. Imperfections in the manufacture of the pole piece can induce severe distortions in the magnetic field symmetry, which induce distortions that will ultimately limit the lenses' ability to reproduce the object plane. The exact dimensions of the gap, pole piece internal diameter and taper, as well as the overall design of the lens is often performed by finite element analysis of the magnetic field, taking into account of the thermal and electrical constraints of the design. The coils which produce the magnetic field are located within the lens yoke. The coils can contain a variable current, but typically utilize high voltages, and therefore require significant insulation in order to prevent short-circuiting the lens components. Thermal distributors are placed to ensure the extraction of the heat generated by the energy lost to resistance of the coil windings. The windings may be water-cooled, using a chilled water supply in order to facilitate the removal of the high thermal duty.

A magnetic lens may include a magnetic material and exciting coils for providing magnetomotive force to a magnetic circuit having field lines through the magnetic material and between pole faces.

For the deflection system 7, it may include a macroscopic deflection sub-system 71 and a microscopic deflection sub-system 72. The deflection system 7 causes the beam to position at, and scan across, a large field of view (FOV) on a specimen plane 8 of a specimen under examination in a specimen holder 9 and one or more small FOVs within the large FOV.

Figure 13:
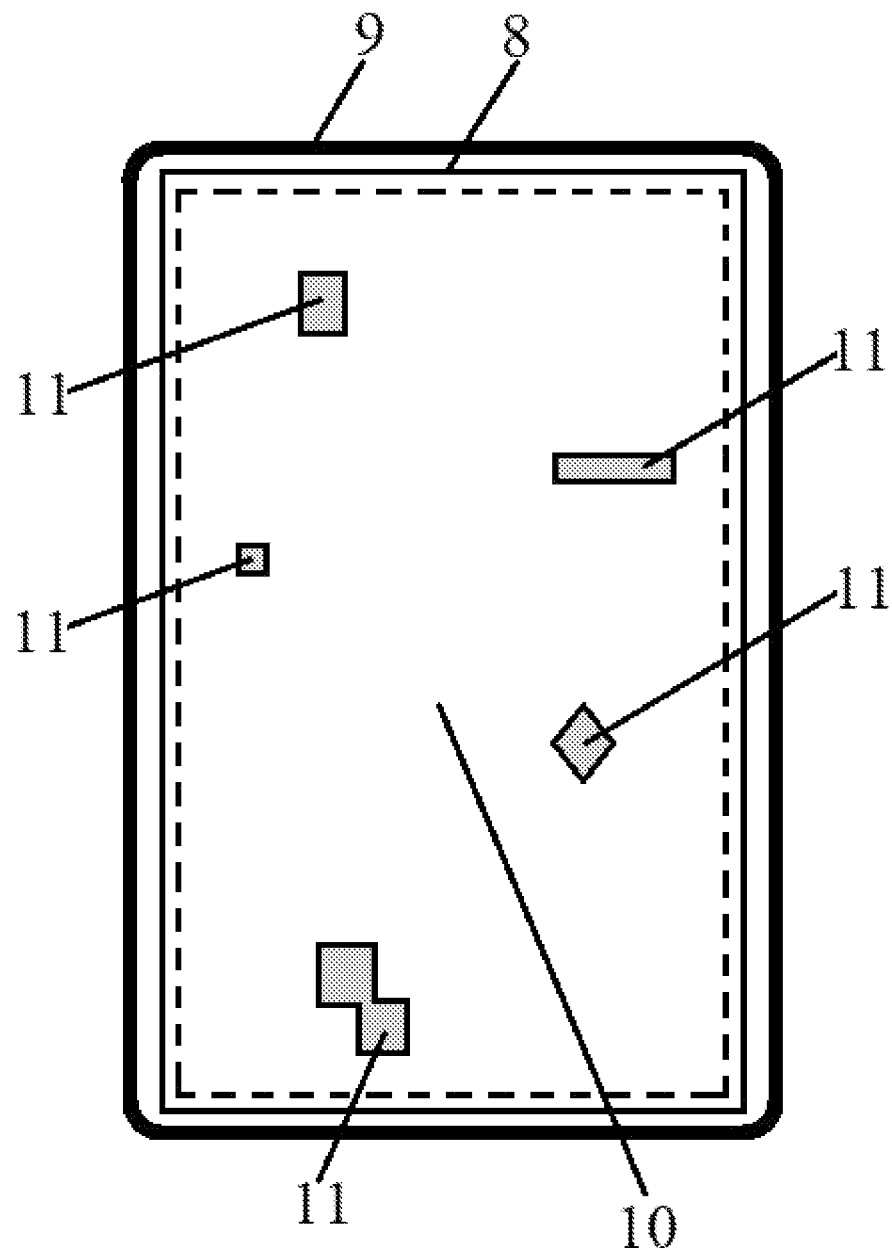
FIG. 13 demonstrates a single large field of view (FOV) on the specimen plane of the apparatus in accordance with an exemplary embodiment of the present invention.
Figure 14:
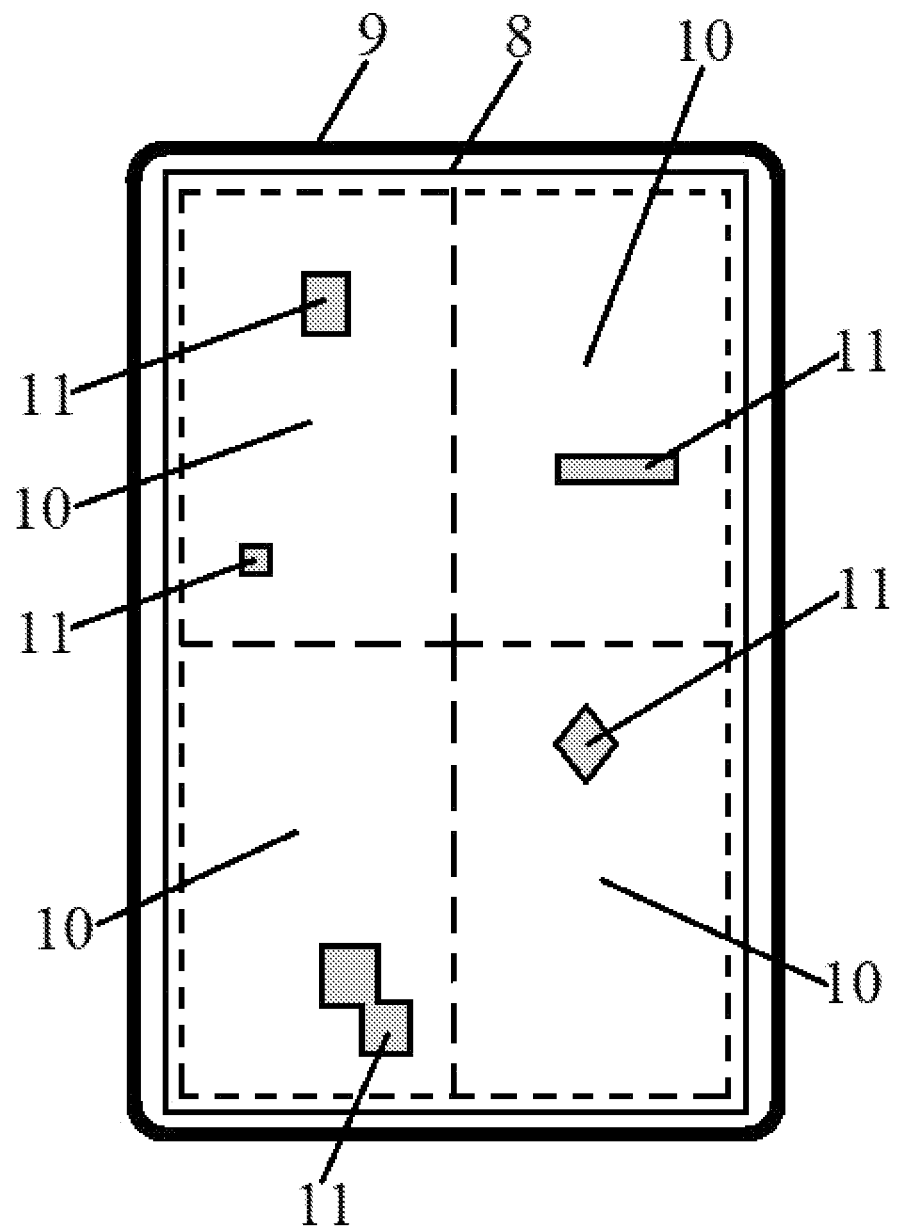
FIG. 14 demonstrates multiple large FOVs on the specimen plane of the apparatus in accordance with an exemplary embodiment of the present invention.

As shown in FIGS. 13 and 14, the macroscopic deflection sub-system 71 causes the beam to scan across a large field of view (FOV) 10 on the specimen plane 8 of the specimen holder 9, and the microscopic sub-deflection system 72 causes the beam to position at, and scan across, one or more small FOVs 11 within a large FOV. As shown in FIG. 13, the specimen plane 8 may contain only one large FOV 10, which may contain zero, one, two, three or more small FOVs 11. In FIG. 14, the specimen plane 8 may contain two, three or more large FOVs 10, each of which may contain zero, one, two, three or more small FOVs 11.

Figure 15:
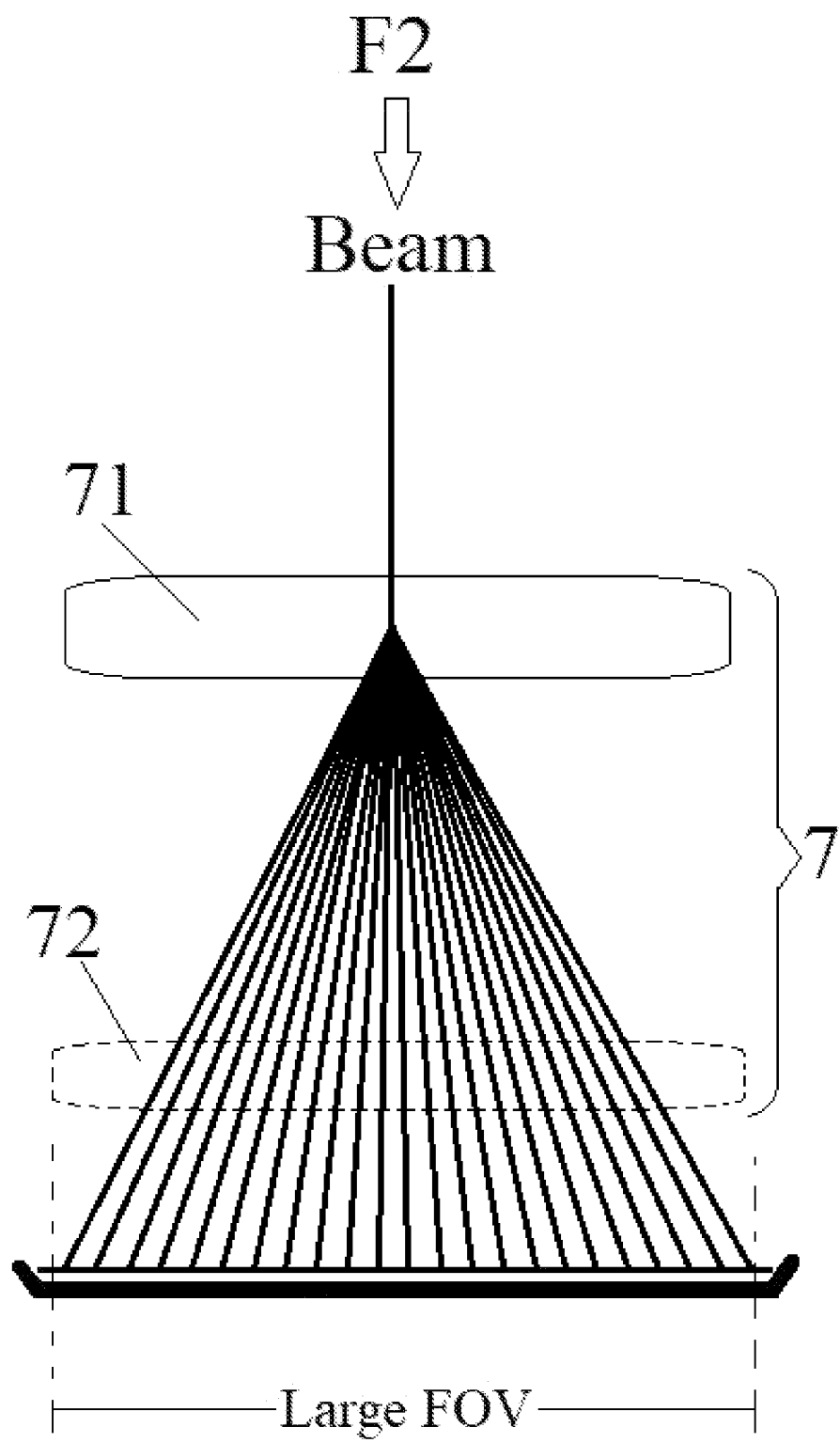
FIG. 15 illustrates a macroscopic deflection sub-system in accordance with an exemplary embodiment of the present invention that alone causes the beam to scan across a large FOV

In the first step of an examination process as shown in FIG. 15, a user may turn off or inactivate the microscopic sub-deflection system 72. Then, the macroscopic deflection sub-system 71 causes the beam to scan across a large FOV 10 on the specimen plane 8 of the specimen holder 9 under a lower resolution (e.g. 10 nm). After the large FOV scanning is completed, the user finds a pattern of interesting (POI) in one or more small FOVs 11 within that large FOV 10, and the user will then zoom into the POI for further examination with a higher resolution (e.g. 1 nm). As an advantage of the present invention, the user will not need to mechanically move the specimen holder 9 to reposition or align the specimen plane 8 to the center of a target small FOV 11. In other words, the specimen holder 9 remains stationary relative to the source 2 of charged particles, no matter the beam is scanning across a given large FOV 10 or subsequently scanning across one, two or more small FOVs 11 within that large FOV 10.

Figure 16:
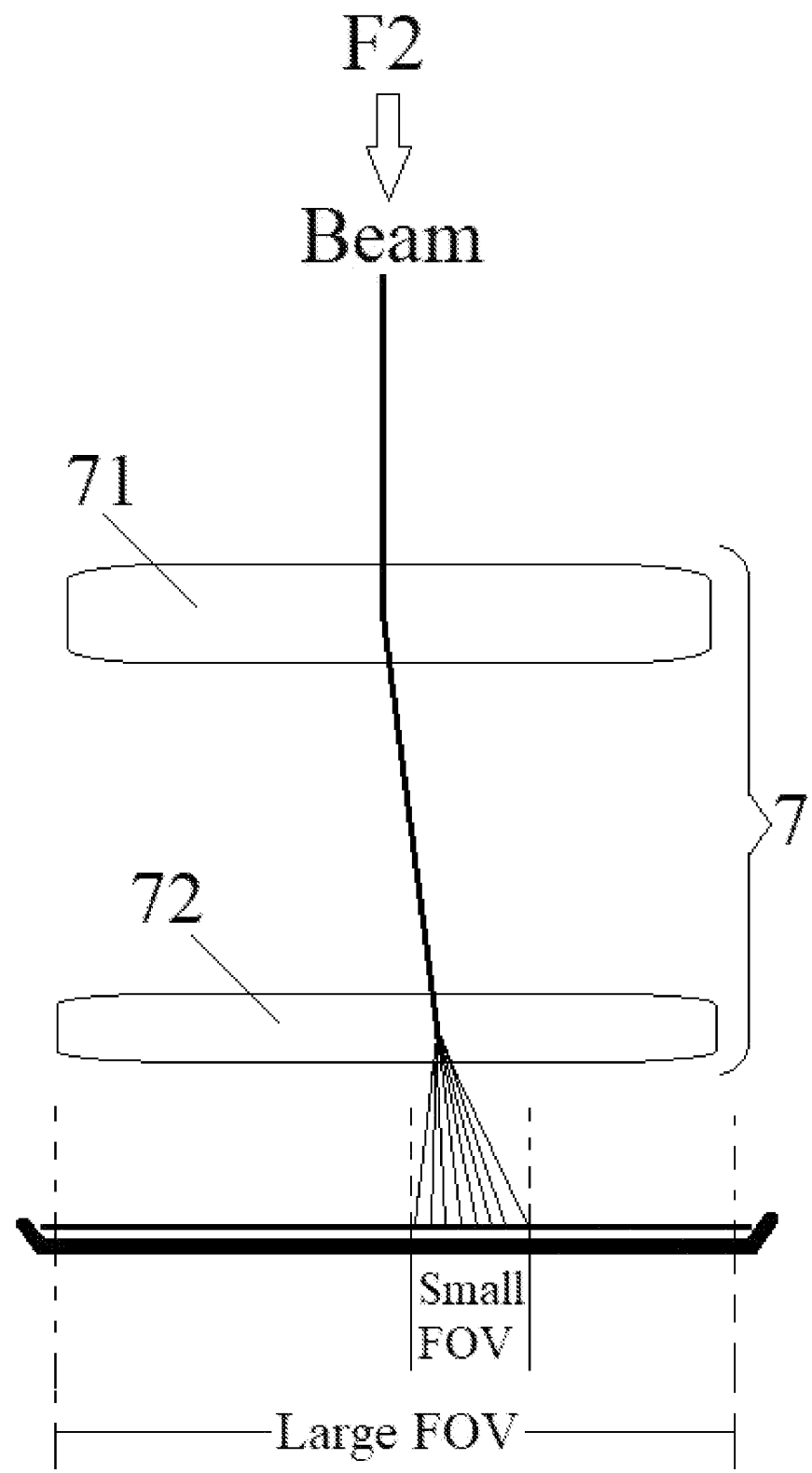
FIG. 16 illustrates a microscopic deflection sub-system causing the beam to scan across a small FOV in accordance with an exemplary embodiment of the present invention.

Instead, the user may run the second step by simply retrieving stored deflecting parameter(s) of the macroscopic deflection sub-system 71 which previously directed the beam to the center of the target small FOV 11. The retrieved deflecting parameter(s) of the macroscopic deflection sub-system 71 will then be re-applied to the subsystem 71, to direct the beam to the center of the target small FOV 11. Generally, the position of any small FOV within a large FOV may be controlled as desired by the macroscopic deflection sub-system 71 by retrieving and re-applying stored deflecting parameters (e.g. voltage). As shown in FIG. 16, after the position of the small FOV within the large FOV is fixed by the macroscopic deflection sub-system 71, the retrieved and re-applied deflecting parameter(s) of the macroscopic deflection sub-system 71 will remain unchanged. Then, the deflecting parameter(s) of the microscopic deflection sub-system 72 is/are varied to cause the beam to scan across the small FOV with a higher resolution.

In various embodiments of the invention, when the beam scans across the large FOV 10 in the first step, the spot F2 has a size A1. When the beam scans across the small FOV 11 within the large FOV 10 in the second step, the spot F2 has a size A2, and A2<A1. The inequation of A2<A1 will result in the resolution for scanning a small FOV is higher than that for a large FOV.

Typically, the size of the large FOV 10 is adjustable, and its image may range from 50 um×50 urn to 200 urn×200 urn in size with a resolution of 0.5-20 nm. For example, the large FOV 10 may have a size of 100 um×100 urn with a resolution of 8 nm. The small FOV 11 (e.g. POI, or area of interest) is also adjustable, and it may range from 0.5 um×0.5 urn to 5 urn×5 urn in size with a resolution of 0.5-2 nm. For example, the small FOV may have a size of 5 um×5 urn with a resolution of 0.5 nm.

As shown in FIG. 17, the macroscopic deflection sub-system 71 may include an upper deflector 71a, and a lower deflector 71b. The microscopic deflection sub-system 72 may be located between the upper deflector 71a and the lower deflector 71b of the macroscopic deflection system 71. The specimen holder 9 may be downstream with respect to the lower deflector 71b of the macroscopic deflection sub-system 71. As shown in FIG. 18, the microscopic deflection sub-system 72 may also include an upper deflector 72a and a lower deflector 72b.

Any other components known in any apparatus of charged-particle beam or their proper combination may be incorporated in the present invention. For a skilled person in the art, many of the components not shown in FIG. 10 are well-known, for example, suppressor electrode, beam extractor, anode, gun aperture, condenser lens that is responsible for primary beam formation, beam blanker, stigmator for the correction of asymmetrical beam distortions, objective aperture, SEM up detector, deflector, bright field (BF) detector, dark field (DF) detector. A system for the insertion into, motion within, and removal of specimens from the beam path is also needed. The system may include load lock, chamber interlock, lock port, loading and unloading mechanism, and transfer table. Other parts in the microscope may be omitted or merely suggested. In a specific yet exemplary electron microscope 1 as shown in FIG. 19, the source of charged particles may be an electron gun 2 configured to emit an electron beam through gun aperture 12. Along the beam trajectory, co-condenser 3 with magnetic coil 3C is placed between gun aperture 12 and co-condenser 4 with a magnetic coil 4C. The electron beam is focused to crossover spot F2 before it passes through beam blanking 13. After the beam passes through objective aperture 14, it is deflected by an upper deflector 71a and a lower deflector 71b in the macroscopic deflection sub-system 71. It can also be deflected by an upper deflector 72a and a lower deflector 72b in the microscopic deflection sub-system 72. In the meanwhile, the beam is focused by the magnetic objective lens 6 onto a specimen within the specimen holder 9. Electrons scattered from and penetrated through the specimen are detected by the BSE detector 15, BF detector 16 and DF detector 17 for generating specimen images. Deflectors 71a, 72a, 72b and 71b may reside in the central bore the magnetic objective lens 6, and they are disk-shaped rings which are axially symmetric about the Z-axis. Each deflector may have a same or different diameter and may fit at a particular position along the Z-axis. An actual bucket-shaped structure may be used to holds the deflectors, and the structure is inserted into the bucket-shaped space of the lens system thus making assembly easier.

The multiple deflection system (71a, 71b, 72a and 72b) is designed to control electron deflection with different FOV size. For example, deflectors or deflection nodes 71a and 71b control electron beam to be incident on a large FOV, while deflectors 72a and 72b on a small FOV size.

Figure 20:
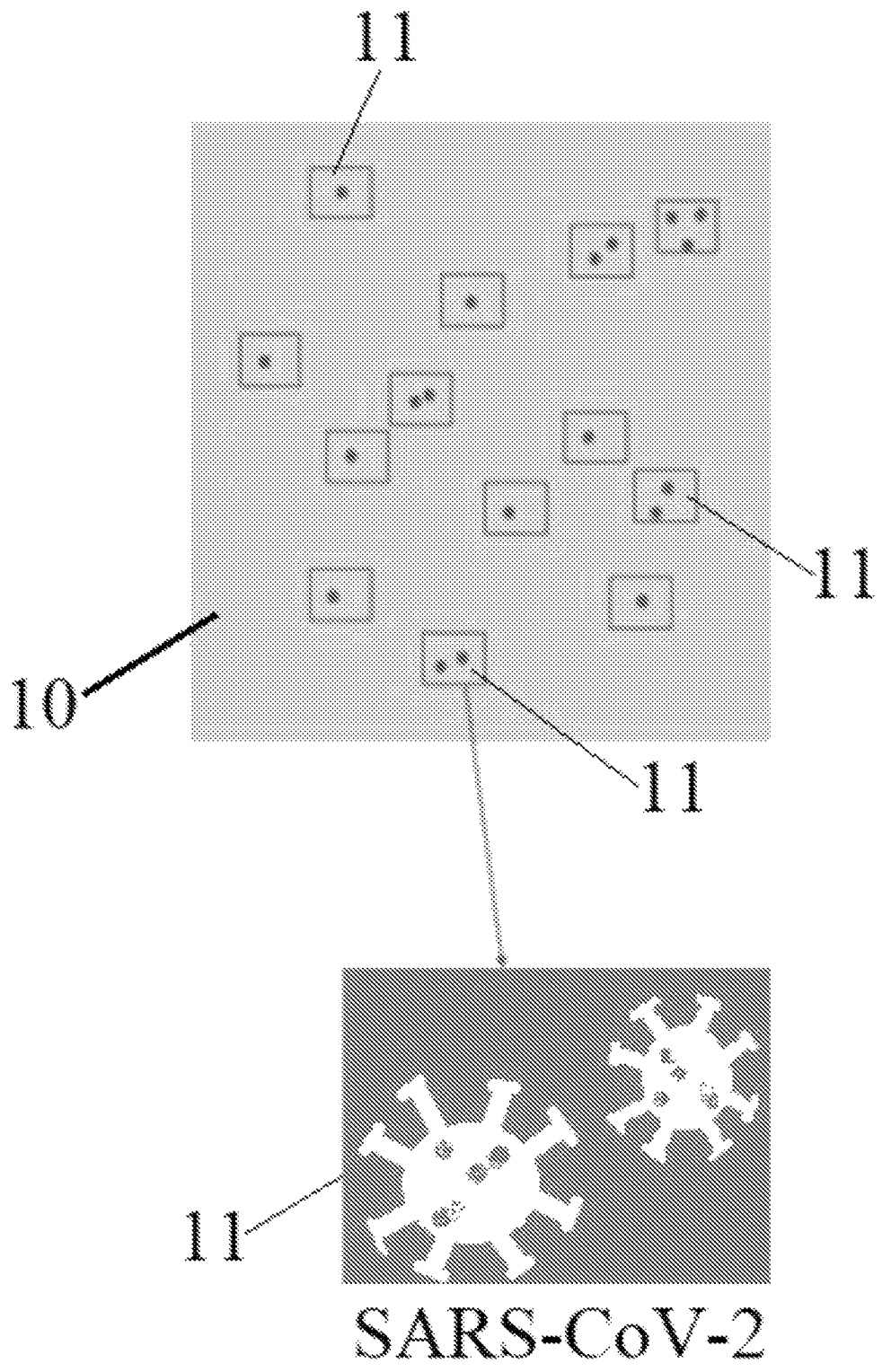

The novel EM column system as shown in FIG. 19 can scan larger FOV with low resolution (like 5, 10 or 20 nm) for the full FOV size. Then, the EM column can switch to high resolution (like 1 nm) automatically without any position and focus change and start immediately to scan high resolution image on any special location. A specific software algorithm can be used to control EM scanning of a larger FOV image with two deflectors (71a, 71b) and co-condensers (3, 4) in a lower resolution mode (i.e. a higher contribution from co-condenser 3 or lower contribution from co-condenser 4). The algorithm will detect related POI (pattern of interesting) and record related location(s). As shown in FIG. 20, the algorithm can detect related POI (pattern of interesting) such as the morphological features of Covid-19 virus (SARS-CoV-2) in a biological sample and record their location(s). Then the software will switch co-condensers (3, 4) to a higher resolution mode (i.e. a lower contribution from co-condenser 3 or a higher contribution from co-condenser 4). The two deflection nodes (71a and 71b) are set to or fixed to a controlled voltage. Other two deflection nodes (72a and 72b) are then used to scan a small FOV 11 with the higher resolution. As shown in the lower panel of FIG. 20, an image of Covid-19 virus (SARS-CoV-2) with a high resolution is acquired. A software system can combine BSE, DF, BF's images from TEM/STEM system and use a machine learning (ML) algorithm to generate an enhanced image with differenced image resolution. Such operations, tasks, and functions are sometimes referred to as being computer-executed, computerized, processor-executed, software-implemented, or computer-implemented. They may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or executable instructions that, when executed by one or more processor devices, cause the host computing system to perform the various tasks. In certain embodiments, the program or code segments are stored in a tangible processor-readable medium, which may include any medium that can store or transfer information. Examples of suitable forms of non-transitory and processor-readable media include an electronic circuit, a semiconductor memory device, a ROM, a flash memory, an erasable ROM (EROM), a floppy diskette, a CD-ROM, an optical disk, a hard disk, or the like.

Through the above description of the embodiments, those skilled in the art can understand clearly that the present application may be implemented by means of software plus necessary hardware platforms, or of course, may also be implemented all by software or hardware. Based on such understanding, the entirety of or a portion of that the technical solutions of the present application contribute over the background art may be embodied in the form of a software product. The computer software product may be stored in storage medium, such as ROM/RAM, disk, optical disk, etc., and comprise several instructions for enabling one computer apparatus (which may be a personal computer, a server, or a network equipment, etc.) to execute the methods described in the respective embodiments or described in certain parts of the embodiments of the present application.

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. A backscattered electron (B SE) detector comprising two or more detection components that are electrically isolated from each other;
   wherein each of the detection components includes a single continuous top metal layer configured for directly receiving incident backscattered electrons and for backscattered to penetrate therethrough; and
   wherein the thickness of one of the top metal layers is different from the thickness of another one of the top metal layers.

2. The BSE detector according to claim 1, which is a semiconductor detector, wherein the top metal layers are:
   readout aluminum strips capacitively coupled to $P^+/N^+$ implant (or P-type or N-type semiconductor) using a $Sio_2$ dielectric (AC coupled); or
   readout aluminum strips reading charges directly out of silicon (DC coupled).

3. The BSE detector according to claim 1, wherein the top metal layers of different thicknesses are arranged in a repeated pattern or profile.

4. The BSE detector according to claim 3, comprising a face region defined by a circumference of an outer boundary circle and a circumference of an inner boundary circle that is concentric with the outer boundary circle, wherein all the top metal layers are arranged within the face region.

5. The BSE detector according to claim 4, wherein each of the top metal layers is enclosed or defined by an arc of the outer boundary circle, an arc of the inner boundary circle, and two radius segments of the outer boundary circle;
   wherein each of the two radius segments has a length (or radial width) that equals to or less than the radius of the outer boundary circle minus the radius of the inner boundary circle;
   wherein the arc of the outer boundary circle and the arc of the inner boundary circle share the same central angle $\theta$; and
   wherein $0 < \theta < 180°$.

6. The BSE detector according to claim 5, comprising N identical top metal layers, wherein integer $N \geq 2$, 4, 8, 16, 32, 64, 128, 256, 512, 1024, 2048, or 4096.

7. The BSE detector according to claim 4, wherein each of the top metal layers has a ring shape that is enclosed or defined by a larger circle and a smaller circle,
   wherein the larger circle and the smaller circle are any two adjacent circles selected from the outer boundary circle, the inner boundary circle, and one or more middle circles between the outer boundary circle and the inner boundary circle, and wherein the one or more middle circles are all concentric with the outer boundary circle and the inner boundary circle.

8. The BSE detector according to claim 7, wherein the concentric top metal layers are further divided into 2, 4, 8, 16, 32, 64, 128, 256, 512, 1024, 2048, 4096 or more identical circular sectors.

9. The BSE detector according to claim 1, further comprising one or more metal wires located between said two or more detection components for outputting signals generated by the detection components.

10. The BSE detector according to claim 9, wherein the detection components having a same thickness of top metal layer are configured to output their signals through a same metal wire.

11. The B SE detector according to claim 9, wherein the thickness of the top metal layers is varied from 5 to 100 nm.

12. An apparatus of charged-particle beam, comprising one or more BSE detectors according to claim 1.

13. The apparatus of charged-particle beam according to claim 12, comprising a charged-particle optical column and a sample chamber, wherein said one or more BSE detectors are installed inside the charged-particle optical column or the sample chamber.

14. The apparatus of charged-particle beam according to claim 13, wherein the charged-particle optical column includes one or more charged-particle optical components along the beam path, selected from a source of charged particles configured to emit a beam of charged particles condenser(s), stigmator(s), alignment coil(s), alignment plate(s), beam blanking(s), plate(s) with objective (or limiting) aperture(s), plate(s) with spread aperture(s), deflector(s), magnetic objective lens(es), and detector(s); and wherein the sample chamber includes one or more chamber components selected from a specimen holder 9 for holding a specimen under examination, a receptacle for receiving a lithographical workpiece processed with the beam.

15. The apparatus of charged-particle beam according to claim 14, wherein said one or more charged-particle optical components within the column are electron optical components, which are selected from the following (from upstream to downstream): an electron gun 2 configured to emit an electron beam, a first co-condenser 3, a second co-condenser 4, a beam blanking 13, a plate with an objective aperture 14, a stigmator (71s), an upper macroscopic deflector 71a, an upper microscopic deflector 72a, a lower microscopic deflector 72b, a lower macroscopic deflector 71b, a magnetic objective lens 6, and a BSE or SE detector 15.

16. The apparatus of charged-particle beam according to claim 15, which is an electron microscope or an electron beam lithography apparatus.

17. A method of imaging comprising:
(i) using an apparatus of charged-particle beam according to claim 13 for imaging a sample material,
(ii) detecting backscattered electrons from the sample material with said one or more BSE detectors, and
(iii) inputting signals from the detection components having top metal layers of different thicknesses into different signal amplifier circuits to get different energy bands of BSE image.

18. The method of imaging according to claim 17, further comprising
(iv) combining different energy band BSE signals to enhance a 3D information of the sample material based on image operations.

19. The method of imaging according to claim 18, further comprising
(v-1) revealing defects at different depths of the sample material or defects with different depths within the sample material based on the enhanced 3D information of the sample material.

20. The method of imaging according to claim 18, further comprising (v-2) revealing composition variation of the sample material.

* * * * *